United States Patent
Koval et al.

(10) Patent No.: US 10,825,831 B1
(45) Date of Patent: Nov. 3, 2020

(54) NON-VOLATILE MEMORY WITH STORAGE NODES HAVING A RADIUS OF CURVATURE

(71) Applicant: Intel Corporation, Santa Clara, CA (US)

(72) Inventors: Randy J. Koval, Boise, ID (US); Henok T. Mebrahtu, Meridian, ID (US); Krishna K. Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/457,694

(22) Filed: Jun. 28, 2019

(51) Int. Cl.
| | |
|---|---|
| *H01L 27/115* | (2017.01) |
| *H01L 29/40* | (2006.01) |
| *H01L 21/02* | (2006.01) |
| *H01L 21/32* | (2006.01) |
| *H01L 27/11582* | (2017.01) |
| *H01L 29/423* | (2006.01) |
| *H01L 27/11556* | (2017.01) |
| *H01L 21/311* | (2006.01) |
| *H01L 21/3213* | (2006.01) |
| *H01L 21/28* | (2006.01) |

(52) U.S. Cl.
CPC .... *H01L 27/11582* (2013.01); *H01L 21/0262* (2013.01); *H01L 21/02164* (2013.01); *H01L 21/02271* (2013.01); *H01L 21/02532* (2013.01); *H01L 21/02595* (2013.01); *H01L 21/02636* (2013.01); *H01L 21/31111* (2013.01); *H01L 21/32133* (2013.01); *H01L 27/11556* (2013.01); *H01L 29/40114* (2019.08); *H01L 29/40117* (2019.08); *H01L 29/4234* (2013.01); *H01L 29/42324* (2013.01)

(58) Field of Classification Search
CPC ......... H01L 27/11582; H01L 29/40114; H01L 29/40117; H01L 21/02532; H01L 21/0262; H01L 21/02636; H01L 29/42324; H01L 21/02164; H01L 21/32133; H01L 27/11556; H01L 21/31111; H01L 21/02271; H01L 21/02595; H01L 29/4234
USPC ........................................................ 257/316
See application file for complete search history.

(56) References Cited

U.S. PATENT DOCUMENTS

| | | |
|---|---|---|
| 9,773,882 B1 | 9/2017 | Lee |
| 10,381,376 B1 * | 8/2019 | Nishikawa ........ H01L 27/11582 |
| 2009/0283819 A1 | 11/2009 | Ishikawa et al. |
| 2015/0357413 A1 * | 12/2015 | Zhang ................. H01L 27/1157 |
| | | 257/324 |
| 2015/0364485 A1 | 12/2015 | Shimura et al. |

(Continued)

OTHER PUBLICATIONS

Extended European Search Report for Patent Application No. 20162300.6, dated Aug. 18, 2020, 8 pages.

*Primary Examiner* — Caleen O Sullivan
(74) *Attorney, Agent, or Firm* — Compass IP Law, PC

(57) ABSTRACT

Storage node configurations are described. A storage node (e.g., a floating gate or a charge trap layer of a three-dimensional (3D) NAND flash device) include a channel-facing surface with a radius of curvature. For example, a channel-facing surface of the storage node may be concave. A control gate-facing surface of the storage node may instead, or additionally, also include a radius of curvature. The radius of curvature of the channel-facing and/or control gate-facing surfaces of the storage node is less than or equal to the radius of the channel layer.

21 Claims, 25 Drawing Sheets

(56) References Cited

U.S. PATENT DOCUMENTS

2017/0338243 A1\* 11/2017 Sohn .................. H01L 27/1157
2019/0043960 A1    2/2019 Koval et al.

\* cited by examiner

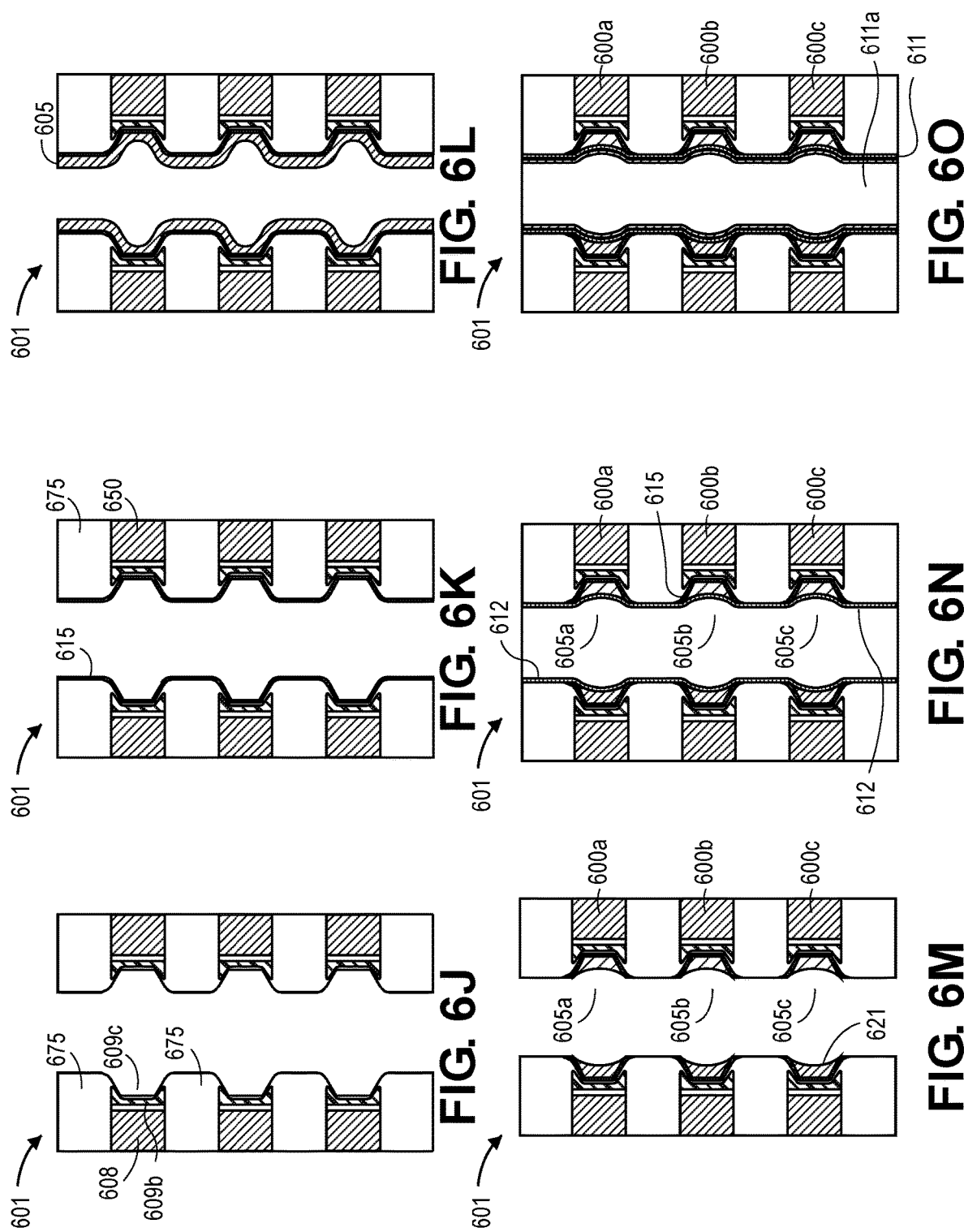

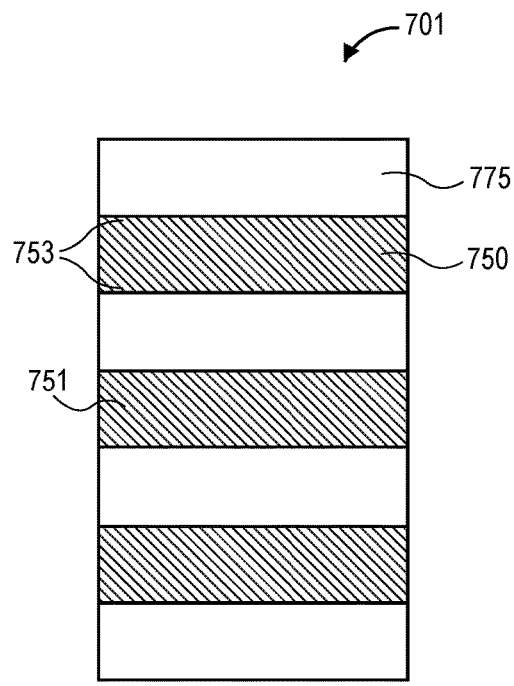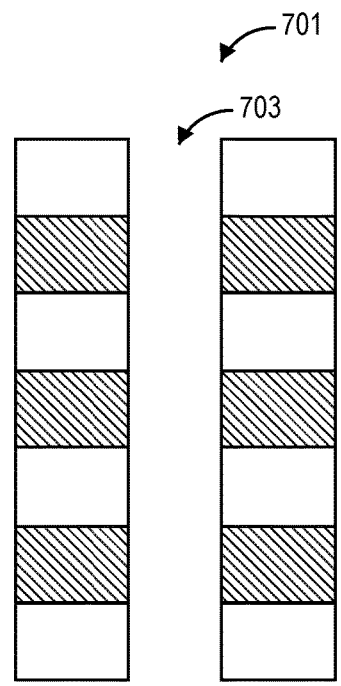
FIG. 7A  FIG. 7B
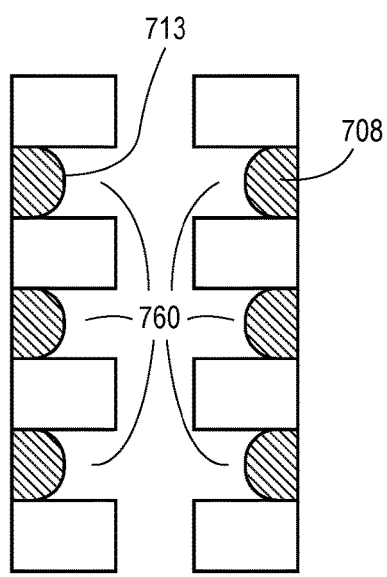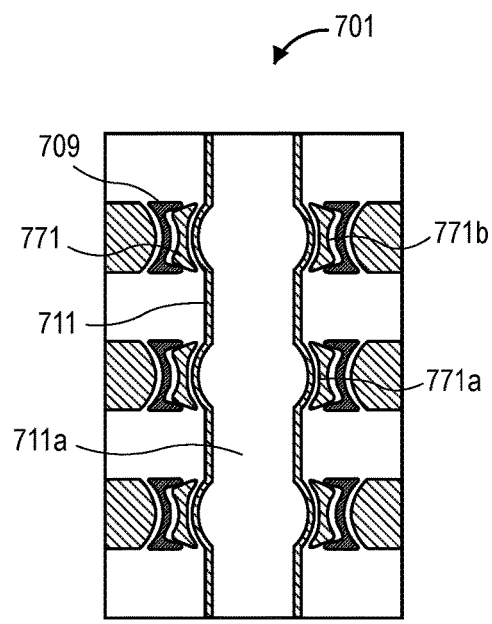
FIG. 7C  FIG. 7D

NON-VOLATILE MEMORY WITH STORAGE NODES HAVING A RADIUS OF CURVATURE

FIELD

The descriptions are generally related to non-volatile storage devices such as three-dimensional (3D) NAND devices, and more particular descriptions are related to memory/storage node (e.g., floating gate or charge trap) configurations of non-volatile storage devices.

BACKGROUND

Flash storage, such as NAND flash memory, is a nonvolatile storage medium. Nonvolatile storage refers to storage having a state that is determinate even if power is interrupted to the device. Three dimensional (3D) NAND flash memory refers to NAND flash memory in which a NAND string may be built vertically so that FETs of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. There are continuing efforts to increase the bit density of 3D non-volatile memories, however, significant challenges are often encountered when attempting to shrink feature sizes.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIGS. 7A-7D illustrate cross-sectional side views of various stages of a process of forming an integrated circuit with a memory node having a radius of curvature.

Descriptions of certain details and implementations follow, including a description of the figures, which may depict some or all of the embodiments described below, as well as discussing other potential embodiments or implementations of the inventive concepts presented herein.

DETAILED DESCRIPTION

Storage node configurations are described herein. A memory or storage cell includes a storage node to store a logic value. One example of a storage node is the floating gate of a floating gate-based NAND device. Another example of a storage node is the charge trap feature of a charge trap-based NAND device. Other memory technologies include other types of storage nodes to store logic values.

The storage nodes described herein include one or more surfaces having a radius of curvature. By introducing one or more radii of curvature on surfaces that were conventionally non-curved, the performance of the memory cell can be improved. For example, the channel-facing side of the storage node may have a curved surface. In another example, the control gate-facing side of the storage node includes a curved surface. A storage node having one or more radii of curvature that are less than or equal to the radius of the channel may have an improved threshold voltage (Vt) window.

Figure 1A:
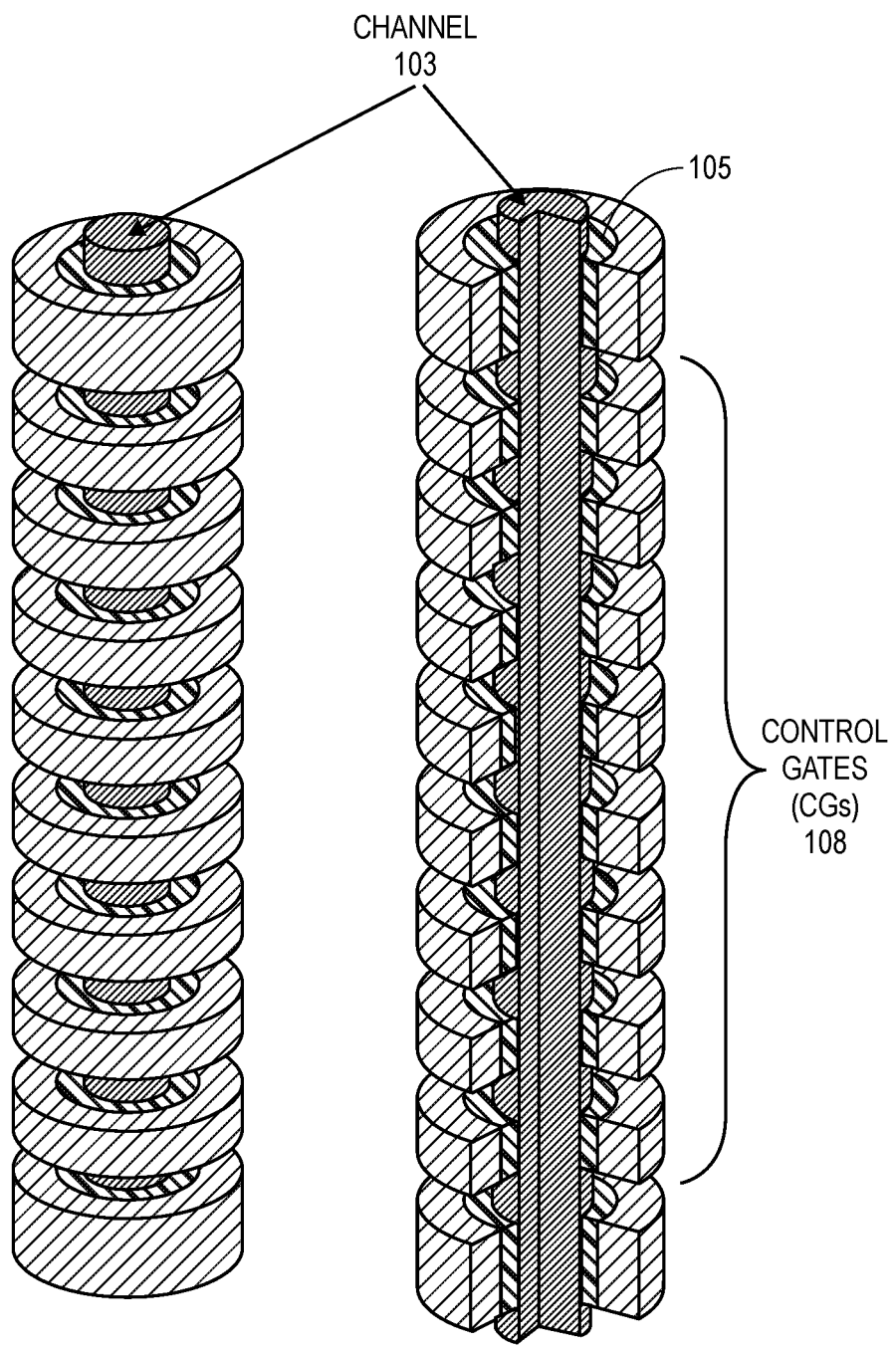
FIG. 1A illustrates an example of a string of NAND memory cells with a surround-gate structure around a channel.
Figure 1B:
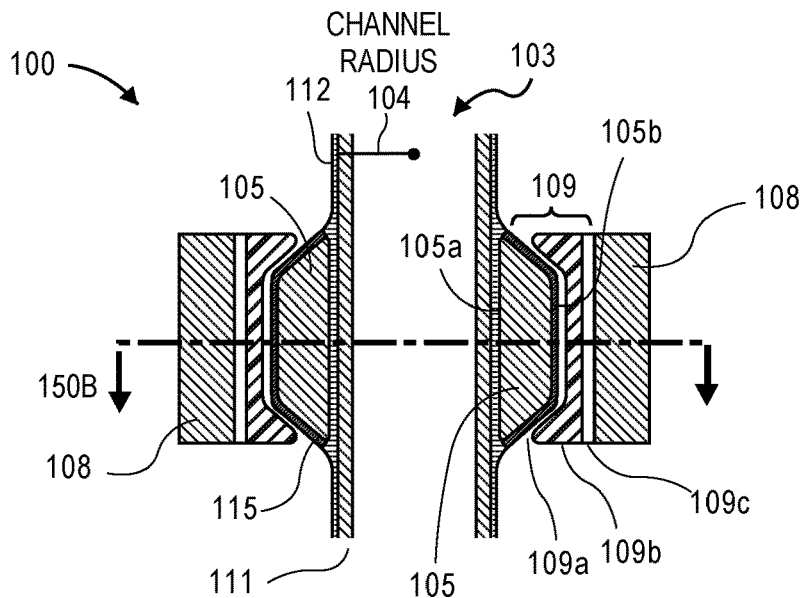
FIGS. 1B and 1C illustrate an example of a memory cell.
Figure 1C:
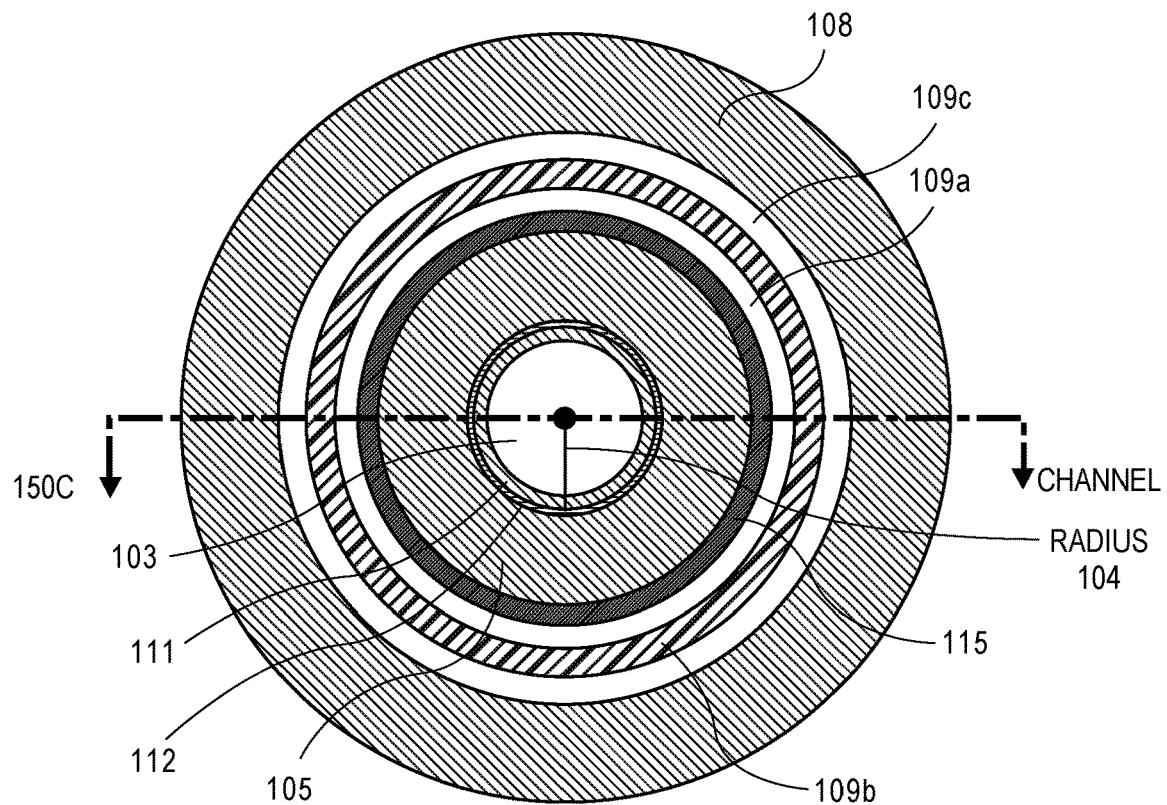

FIGS. 1A, 1B, and 1C illustrate different views of examples of three-dimensional (3D) NAND memory cells. FIG. 1A illustrates an example of a string of NAND memory cells with a surround-gate structure around a channel. FIG. 1B illustrates a side cross-sectional view of an exemplary memory cell and FIG. 1C illustrates a top cross-sectional view of an exemplary memory cell. The line 150B of FIG. 1B illustrates the location of the cross-sectional view of FIG. 1C, and the line 150C of FIG. 1C illustrates the location of the cross-sectional view of FIG. 1B.

Referring to FIG. 1A, the 3D NAND string includes a channel 103. In one example, the channel 103 extends from a substrate (e.g., a base wafer or another structure) upon which various materials are deposited, grown, etched, or otherwise processed to create the circuitry for a memory device. In the illustrated example, the string of memory cells has a pillar-like structure with a substantially circular cross-section as seen in FIG. 1C. Typically, a channel is shared among multiple memory cells, with an individual memory cell using a portion of the channel for its channel region.

In the example illustrated in FIG. 1A, storage nodes 105 surround the channel 103. The storage nodes 105 illustrated in FIG. 1A are examples of floating gates. A control gate 108 surrounds each floating gate. Typically, a floating gate-based NAND memory cell includes a floating gate 105, a control gate 108, and shares the channel 103 with vertically adjacent cells in the string. Although not explicitly shown in FIG. 1A, the 3D NAND string typically includes additional layers, such as a channel fill oxide, tunnel dielectric, and blocking dielectric layers, discussed below with respect to FIGS. 1B and 1C.

FIGS. 1B and 1C illustrate an example of a memory cell 100. The memory cell 100 is an example of a memory cell having a storage node without a radius of curvature. The memory cell 100 includes a channel region 103, a floating gate 105 adjacent to or surrounding the channel region 103 along a first side 105a of the floating gate 105. The memory cell 100 also includes a control gate 108 along an opposing side 105b of the floating gate 105. In one example, the floating gate 105 and the control gate 108 include a conductive or semi-conductive material, e.g., polysilicon. The floating gate 105 in this example includes a channel-facing surface 105a and a control gate-facing surface 105b that are non-curved.

In the illustrated example, a multi-layer dielectric (e.g., a multi-layer interpoly dielectric (IPD)) region 109 is disposed between the floating gate 105 and the control gate 108. The IPD region 109 may include multiple layers. In the example illustrated in FIG. 1B, the IPD region 109 includes three IPD layers 109a, 109b, and 109c. In the illustrated example, a barrier layer 115 is disposed between the IPD region 109 and the floating gate 105. The barrier layer 115 is typically also a dielectric layer, and thus could be considered a fourth layer of the multi-layer dielectric region 109.

The channel region 103 may include a channel liner or channel semiconductor film 111. In one such example, the channel liner 111 includes a semiconductor material such as polysilicon and may be included adjacent to or surrounding a tunnel dielectric layer 112. The channel liner 111 has a channel radius 104. The channel radius 104 is the distance from the center of the channel region 103 to the intersection of the channel liner 111 and the tunnel dielectric 112. In one example, the pillar includes channel fill such as a dielectric material (e.g., silicon oxide or other suitable fill material). Although FIGS. 1A-1C illustrate 3D NAND cells with a floating gate, other architectures are possible. For example, a memory cell can include a charge trap layer between the gate and the channel where charge is trapped or stored to represent one or more bit values.

Figure 2:
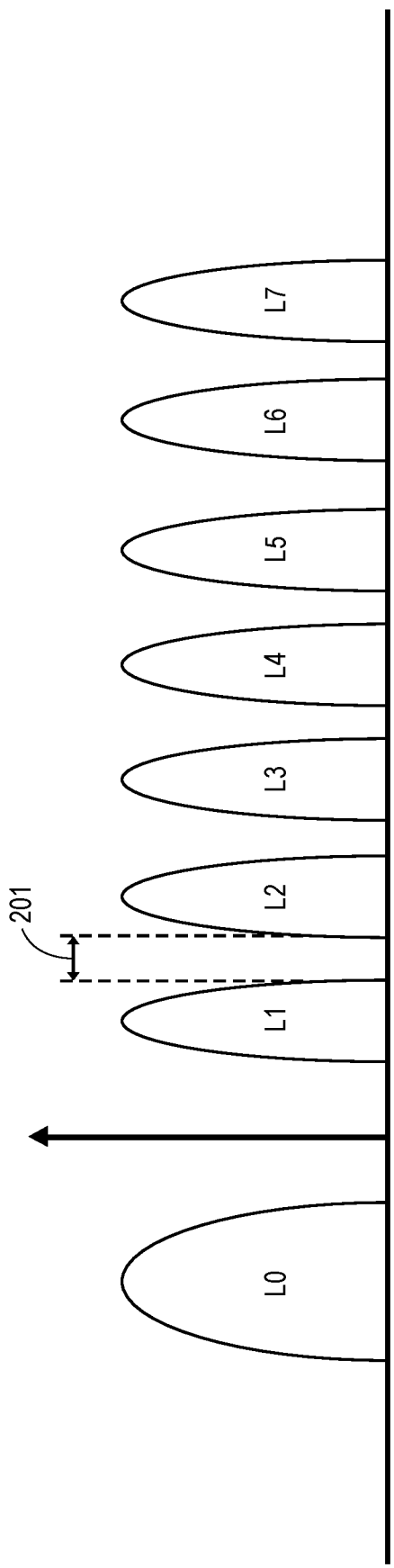
FIG. 2 illustrates an example of threshold voltage distributions for a NAND memory cell.

Memory cells are typically programmable according to an encoding scheme. Various encoding schemes include as SLC (single level cell), MLC (multi-level cell) TLC (triple level cell), QLC (quad level cell), etc. Each cell's threshold voltage (Vt) is indicative of the data that is stored in the cell. FIG. 2 illustrates an example of threshold voltage distributions for a cell with eight levels or states. In one example, Level 0 (L0) corresponds to an erase state of 111, level 1 (L1) corresponds to a first program level of 011, Level 2 (L2) corresponds to a second program level of 001, Level 3 (L3) correspond to a program level of 101, Level 4 (L4) corresponds to a program level of 100, Level 5 (L5) corresponds to a program level of 000, Level 6 (L6) corresponds to a program level of 010, and Level 7 (L7) corresponds to a program level of 110. Thus, the example in FIG. 2 is for a tri-level cell (TLC) that can store 3 bits of data. Similar encoding schemes are typically used for SLC, MLC, and QLC cells.

As devices have adopted encoding schemes to enable each cell to store more bits, the separation between the distributions of adjacent levels (e.g., the separation 201 between L1 and L2 distributions) has tended to decrease. Close or overlapping distributions of adjacent levels can result in bit errors. Sufficient separation between the distributions of adjacent levels can minimize bit errors, and therefore efforts have been made to increase the separation (sometimes called the Vt window) between distributions of adjacent levels. Past techniques to improve the Vt distribution placements have not scaled favorably when features sizes are reduced. For example, a reduction of the pillar/channel radius has been attempted, however, severe process challenges at the pillar etch have prevented further reduction in the channel radius and thus have limited additional Vt window increases by exploiting E-field/tunnelling.

In contrast, a storage node with a radius of curvature enables improved Vt distribution placement that scales favorably with feature size reduction. FIGS. 3A-3F illustrate examples of cross sections of 3D NAND storage nodes with a radius of curvature. The storage nodes of FIGS. 3A-3F are examples of the charge-storing feature of a single cell of a 3D NAND device, such as the floating gate 105 of FIGS. 1A-1C. The optimized storage node configuration can apply to both floating gate NAND cells and charge trap NAND cells. FIGS. 3A-3D illustrate examples of a floating gate structure and FIGS. 3E-3F illustrate examples of a charge trap structure. Note that the radii of curvature and the channel radius are for illustrative purposes and are not drawn to scale.

Figure 3A:
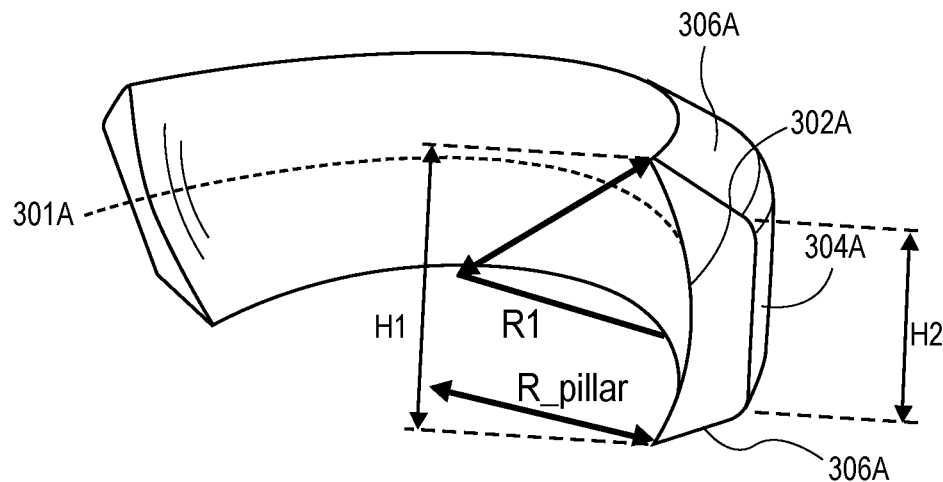
FIGS. 3A-3F illustrate cross sections of exemplary storage nodes.

Turning first to FIG. 3A, a cross-section of a portion of a floating gate is illustrated. The floating gate surrounds a channel, such as the channel 103 of FIGS. 1A-1C. In one example, the floating gate includes a conductive or semi-conductive material such as polysilicon. The length of the floating gate along a direction of the channel is longer than a length of the floating gate along an orthogonal direction of the channel. In this example, the channel-facing surface 302A of the floating gate layer is curved. Specifically, in the illustrated example the channel-facing surface 302A of the floating gate layer is concave. In the example illustrated in FIG. 3A, the opposite or opposing surface 304A is straight (e.g., non-curved). The non-curved surface 304A is parallel to the length of the channel. The side 304A of the floating gate can be referred to as the control gate-facing surface of the floating gate.

In the example illustrated in FIG. 3A, the upper and lower edges 306A of the floating gate are tapered. The tapered edges 306A extend away from the channel side and towards the control gate region. The edges 306A could also be referred to as upper or lower surfaces between the control gate-facing side and the channel-facing side of the storage node. In the illustrated example, the upper and lower surfaces are slanted or sloped such that the distance between the upper and lower surfaces is greater at the channel side than the control gate side. In the illustrated example, the height or thickness H1 of the floating gate at its channel-facing side is greater than the height or thickness H2 of the floating gate at the control gate-facing side. In the illustrated example, the control control-gate facing side of the floating gate to be referred to as multi-faceted, including the surface 304A as well as the surfaces of the upper and lower edges 306A.

In the example illustrated in FIG. 3A, the storage node has a radius of curvature R1 that is comparable to or less than the radius R_pillar of the channel that the storage node surrounds. The radius of curvature at a point on a curved surface is the radius of a circle that best fits the curve at that point. In one example, the radius of curvature R1 is the minimum radius of curvature of the storage node feature. In one example, the minimum radius of curvature R1 is at the center region of the storage node due to its axial symmetry. In the example illustrated in FIG. 3A, the radius of curvature of the storage node is measured at the center region 301A.

The radius of the channel (R_pillar) is the radius of a circular cross-section of the channel (e.g., see the radius 104 of the circular cross-section of a channel in FIG. 1C). Different implementations may have channels with different shapes or profiles, as is discussed in further detail below. The channel film may conform to the topology over which it is deposited. Thus, the radius of a channel may be different depending on where the radius of the channel is measured. For example, for implementations with storage nodes having curved channel-facing surfaces, the channel may have a larger radius at the storage node than at other sections of the pillar (e.g., such as the radius at insulating layers between vertically adjacent cells). In another example, recesses may be etched into the insulating layers between vertically adjacent cells, and therefore the radius of the channel at the insulating layers may be equal to or even greater than the radius of the channel at the storage nodes. In one example, the radius of curvature of the storage node is less than the radius at the narrowest region of the channel. Regardless of the profile of the channel, a radius of curvature of the storage node that is less than or equal to the channel radius can enable an improved Vt window.

Figure 3B:
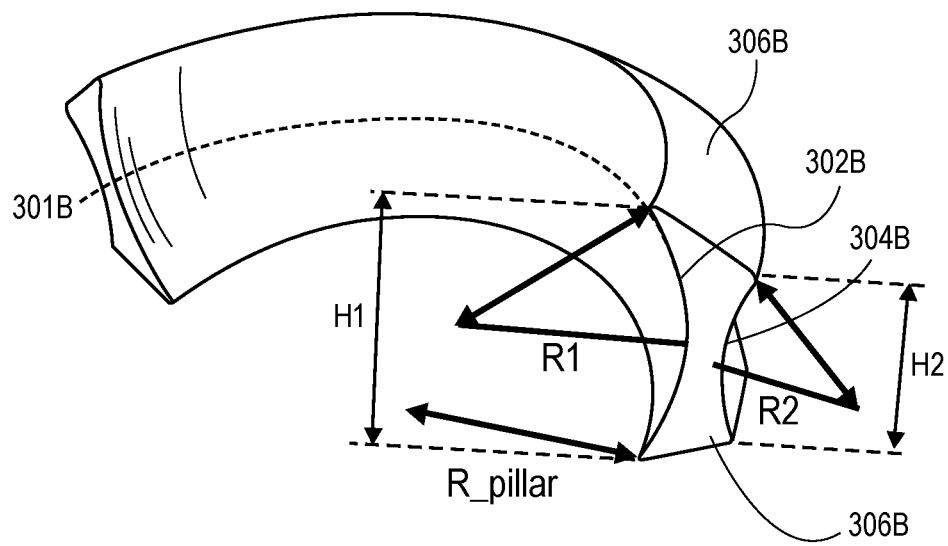

FIG. 3B illustrates a cross-section of a portion of a floating gate with curvature on both a channel-facing surface and a control-gate facing surface. Like in FIG. 3A, the storage node of FIG. 3B has a channel facing surface 302B with radius of curvature R1. However, instead of a straight control gate-facing surface, the storage node illustrated in FIG. 3B has a control-gate facing surface 304B with a second radius of curvature R2. Both the channel-facing surface 302B and the control gate-facing surface 304B are concave.

In the example illustrated in FIG. 3B, the radius of curvature R1 of the storage node is measured at the center region 301B. The radius of curvature R1 is less than or equal to the radius of the channel. The radius of curvature R2 is also measured at the center region 301B at the control gate-facing surface 304B. The radius of curvature R2 is also less than or equal than the radius of the channel. Like in FIG. 3A, the storage node illustrated in FIG. 3B has tapered edges 306B. Thus, the tapered edges 306B extend away from the channel side and towards the control gate region so that the height or thickness H1 of the floating gate at the channel-facing side is greater than the height or thickness H2 of the floating gate at the control gate-facing side.

Figure 3C:
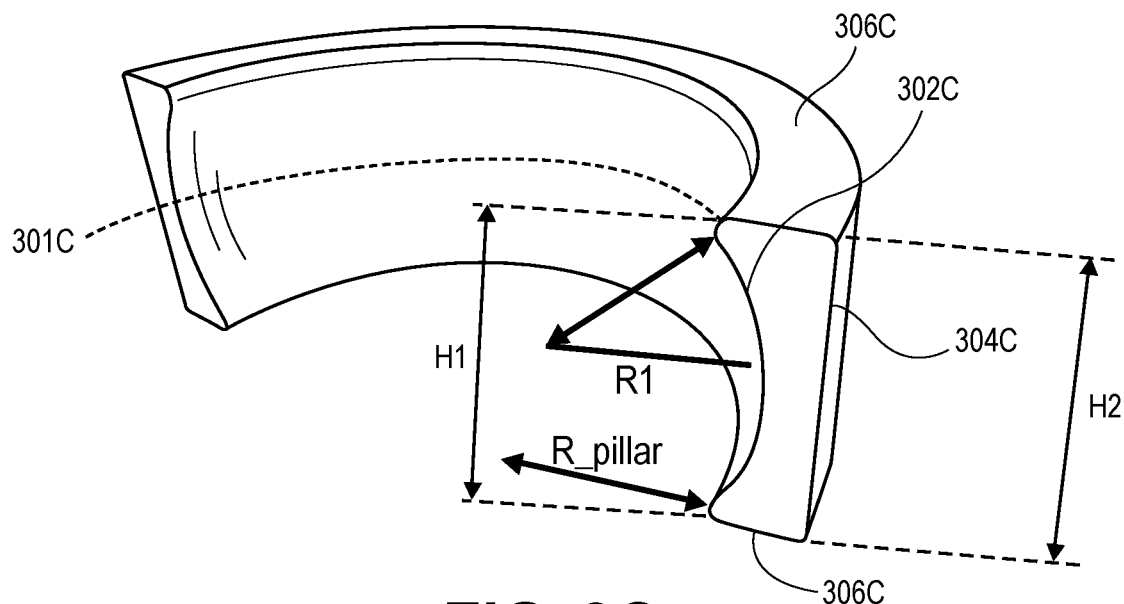

FIG. 3C illustrates a cross-section of a portion of a floating gate with curvature on a channel-facing surface and non-tapered edges. Like FIG. 3A, the storage node of FIG. 3C has a radius of curvature R1 of the channel-facing surface 302C. In the example illustrated in FIG. 3C, the radius of curvature R1 of the storage node is measured at the center region 301C. The radius of curvature R1 is less than or equal to the radius of the channel R_pillar. In the example illustrated in FIG. 3C, the opposite or opposing surface 304C is straight (e.g., non-curved). The non-curved surface 304C is parallel to the length of the channel. Unlike FIGS. 3A and 3B, the upper and lower edges 306C of the storage node are non-tapered (e.g., flat or straight). The upper and lower edges 306C could be referred to as upper and lower surfaces between the channel-facing surface 302C and the control gate-facing surface 304C. In the illustrated example, the upper and lower surfaces or edges 306C are perpendicular (orthogonal) relative to a direction of the channel. Thus, the height or thickness H1 of the channel-facing side and the height or thickness H2 of the control gate-facing side are approximately the same.

Figure 3D:
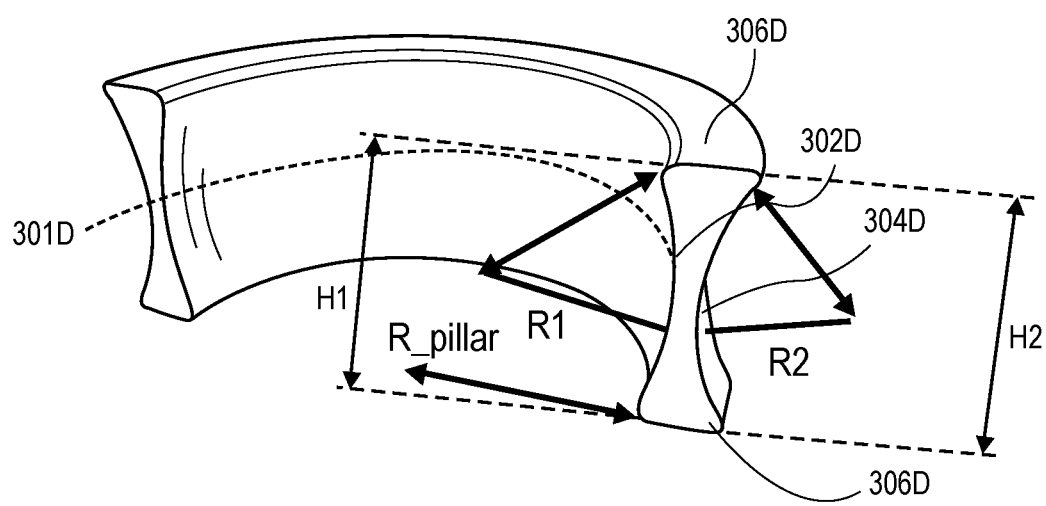
Figure 3E:
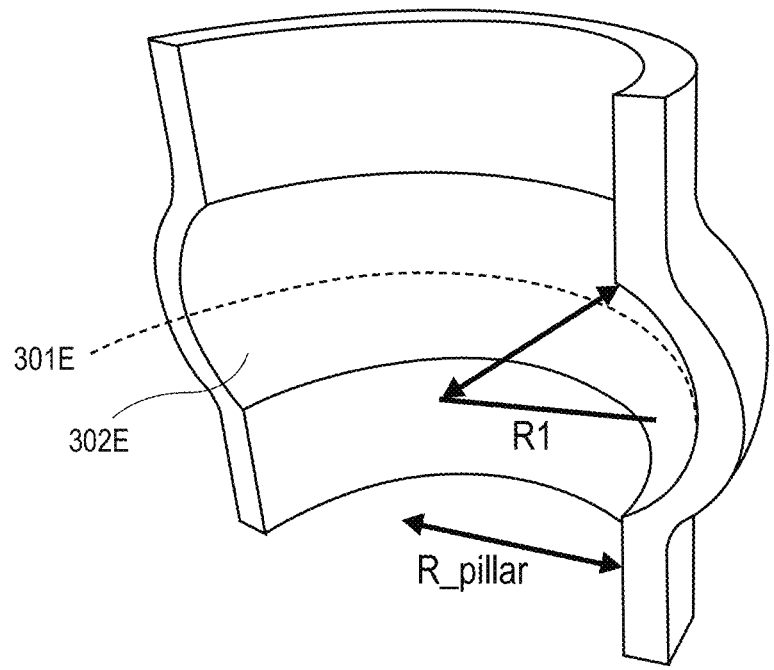
Figure 3F:
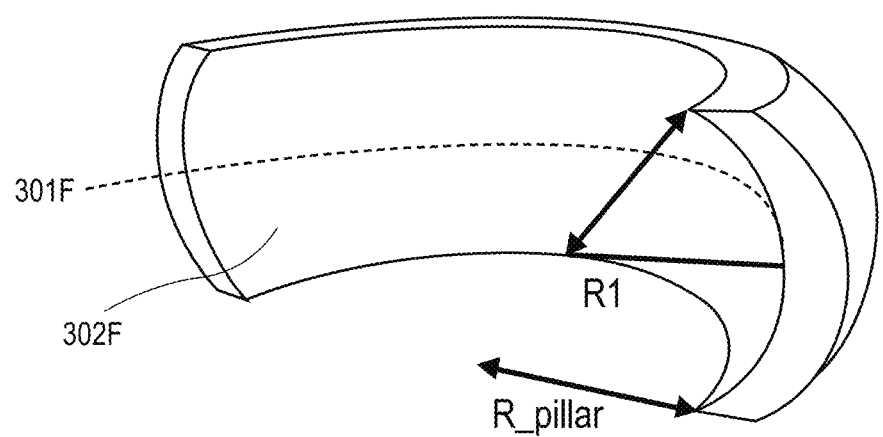

FIG. 3D illustrates a cross-section of a portion of a floating gate with curvature on two sides and non-tapered edges. Like FIG. 3B, the storage node of FIG. 3D has a radius of curvature R1 of the channel-facing surface 302D and a second radius of curvature R2 on its control gate-facing surface 304D. In the example illustrated in FIG. 3D, the radius of curvature R1 of the storage node is measured at the center region 301D. The radius of curvature R1 is less than or equal to the radius of the channel. The radius of curvature R2 is also measured at the center region 301D at the control gate-facing surface 304D. The radius of curvature R2 is also less than or equal than the radius of the channel. Unlike FIG. 3B, the upper and lower edges 306D of the storage node are non-tapered (e.g., flat or straight). The upper and lower edges 306D could be referred to as upper and lower surfaces between the channel-facing surface 302D and the control gate-facing surface 304C. In the illustrated example, the upper and lower surfaces or edges 306D are perpendicular (orthogonal) relative to a direction of the channel. The height or thickness H1 of the channel-facing side and the height or thickness H2 of the control gate-facing side are approximately the same.

FIG. 3E illustrates a cross-section of a portion of a charge trap layer with a radius of curvature on a channel-facing surface. In the example illustrated in FIG. 3E, the radius of curvature R1 of the storage node is measured at the center region 301E. FIG. 3E illustrates an example of a continuous charge trap layer (e.g., the same charge trap layer is continuous from one wordline to the next and therefore shared by multiple vertically stacked cells). The surface 302E that faces the channel has a radius of curvature R1 that is less than or equal to the radius of the channel, R_pillar.

FIG. 3F also illustrates a cross-section of a portion of a charge trap layer with a radius of curvature on its channel-facing surface. The channel-facing surface 302F of the storage node has a radius of curvature of R1. In the example illustrated in FIG. 3F, the radius of curvature R1 of the storage node is measured at the center region 301F. The radius of curvature R1 is less than or equal to the channel radius R_pillar. However, unlike the charge trap layer of FIG. 3E, the charge trap layer in FIG. 3F is not continuous, but is instead isolated (e.g., the charge trap layers are isolated from one another so that the same charge trap layer is not shared by multiple vertically stacked cells).

Figure 4A:
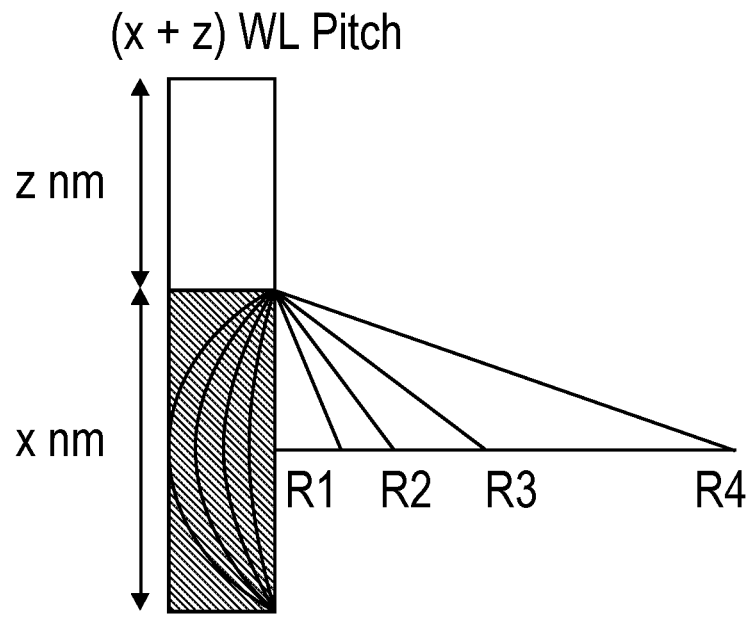
FIGS. 4A and 4B illustrate an example of how the radius of curvature scales relative to tier pitch.
Figure 4B:
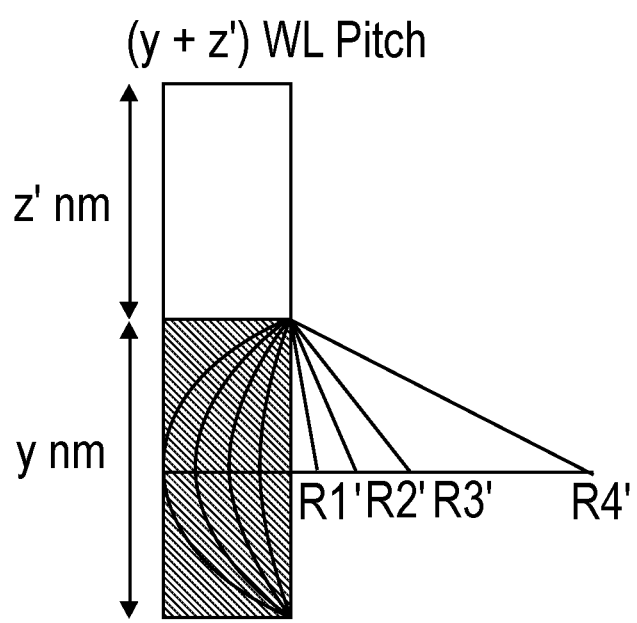

Thus, a variety of storage node technologies can have radii of curvature on one or more surfaces to improve the Vt window. Introducing a radius of curvature on the storage node improves the voltage threshold window for current feature sizes and scales well when tier pitch is reduced. FIGS. 4A and 4B illustrate how the radius of curvature scales relative wordline pitch (which may also be referred to as tier pitch). Wordline pitch is the height/thickness of the wordlines plus the distance between wordlines. FIG. 4A shows one wordline pitch and FIG. 4B shows a second wordline pitch with a scaled down feature size. The wordline pitch of FIG. 4A is (X+Z) nm, where X is the wordline thickness and Z is the height/thickness of the insulating layers separating vertically adjacent wordlines. The wordline thickness may also correspond to, or be the same as, the storage node feature height/thickness. The wordline pitch of FIG. 4B is (Y+Z') where Y is the scaled down wordline thickness and Z' is the height/thickness of the insulating layers separating vertically adjacent wordlines. Therefore, in the illustrated example, Y is less than X; Z' is less than or equal to Z (i.e., the height of the insulating layers may or may not be scaled in this example).

As the technology scales from X to Y, the radial feature in the storage node shrinks significantly. In one example, a 10% reduction in wordline pitch enables a reduction of approximately half of the effective radius of curvature of the storage node (assuming equivalent polysilicon thickness remaining). In the FIGS. 4A and 4B, this effect is shown by the smaller radii of curvature R1', R2', R3', and R4' relative to the radii of curvature at the larger wordline pitch, R1, R2, R3, and R4. The effect can be used to effectively and efficiently scale the cell transistor due to the favourable scaling of features relative to channel radius (e.g., the radius feature preserves the window when tier pitch is scaled). Thus, by shrinking the vertical dimension (wordline pitch), a significantly smaller effective radius for the contours of the storage node can be achieved for improvement of the electrical characteristics of the device.

Figure 5:
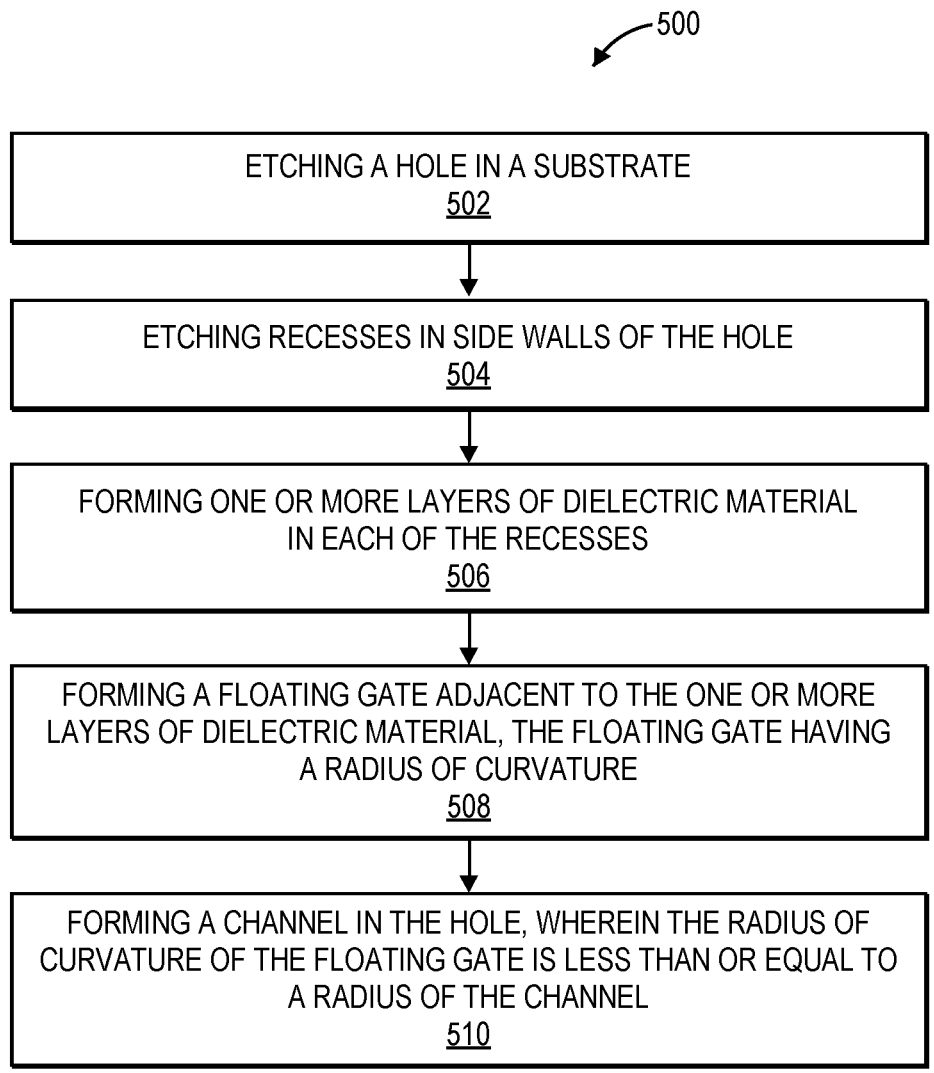
FIG. 5 is a flow diagram of an example of a process of forming an integrated circuit with a memory node having a radius of curvature.
Figure 6A:
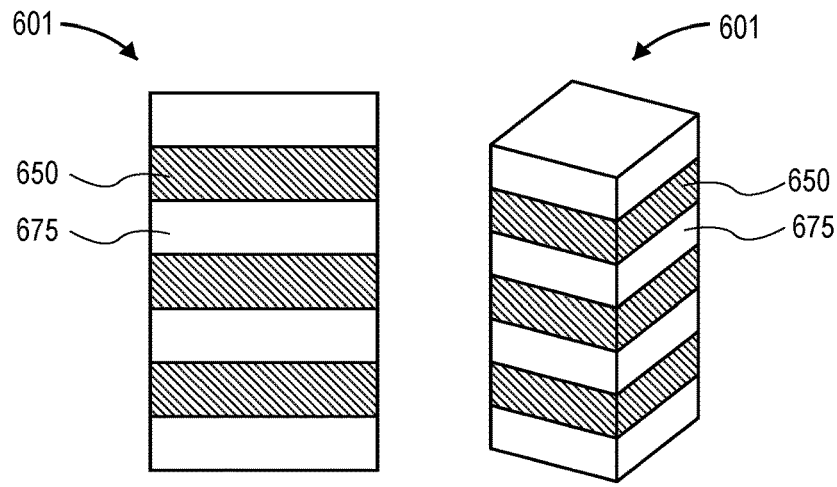
FIGS. 6A-6O illustrate cross-sectional side and perspective views of various stages of a process of forming an integrated circuit with a memory node having a radius of curvature.

A memory node with a radius of curvature can be formed via a variety of techniques. FIG. 5 is a flow diagram of an example of a process 500 of forming an integrated circuit with memory nodes having a radius of curvature. The memory nodes formed via the process 500 are floating gates. The process 500 is one example of how to achieve a floating gate having a radius of curvature that is comparable to or less than the channel radius. Other processes may also be used. FIGS. 6A-6O illustrate cross-sectional side and perspective views of various stages associated with process 500. FIG. 5 and FIGS. 6A-6O are discussed together below.

Turning first to FIG. 5, the process 500 involves processing a substrate, such as the substrate 601 illustrated in FIG. 6A. FIG. 6A illustrates cross-sectional side and perspective views of a substrate 601 including alternating layers 650 and 675. In one example, the alternating layers of the substrate are layers of a conductive/conducting material 650 and an insulating material 675. In one example, forming the substrate 601 involves depositing alternating layers of a conductor 650 and an insulator 675 to form a stack. The insulator may include a dielectric material. For example, the layers 675 of insulating material may include nitrides, oxides (such as silicon oxide, aluminum oxide, or another oxide), or another insulating material. The layer 650 of conducting material may include, for example, polycrystalline silicon (polysilicon), metals, metal nitrides, or other conductive or semi-conductive material. In one example, forming the stack involves chemical vapor deposition (CVD) (such as low-pressure CVD (LPCVD)) deposited polysilicon and silicon oxide. Although the layers 650 and 675 are illustrated as having the same thickness, some implementations may include different thicknesses for the insulating layers 675 and conducting layers 650. In some implementations, the thickness of the layers may be different based on where they are located in the stack (e.g., bottom or top of the stack).

Figure 6B:
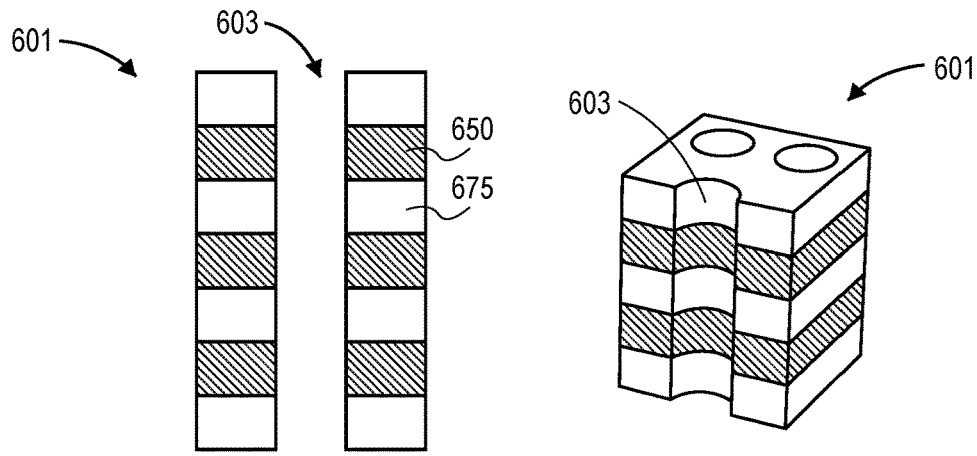

The process 500 involves etching a hole in a substrate, at 502. FIG. 6B illustrates cross-sectional side and perspective views of the substrate 601 with a hole 603 etched through the alternating layers 650 and 675 of the substrate 601. In one example, the hole 603 is for a channel of a NAND string. Forming the hole 603 in the substrate 601 may be accomplished by anisotropic etching of a cylinder-shaped hole or trench through the substrate 601 including the stack of alternating conductor layer 650 and insulator layers 675. Typically, the holes 603 for channel formation are narrow and deep or long (e.g., have a high aspect ratio).

Figure 6C:
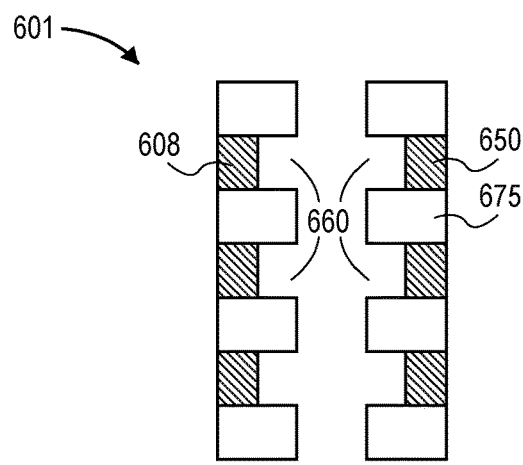

Referring to FIG. 5, after etching the high aspect ratio holes in the substrate, the process 500 involves etching recesses in the side walls of the holes, at 504. FIG. 6C illustrates the substrate 601 after recesses 660 have been etched into the side walls of the holes 603. The recesses 660 may also be referred to as cavities). In the illustrated example, the recesses are formed at or in the conductive layers 650 of the stack. Etching the recesses may include, for example, isotropic etching of the conductor layer 650. In the example illustrated in FIG. 6C, the recesses are etched to be non-curved such that the polysilicon surfaces in the recess are straight (e.g., parallel to the length of the channel hole). In the illustrated example, control gates 608 will be formed from the conductive material 650 in the recesses 660.

Figure 6D:
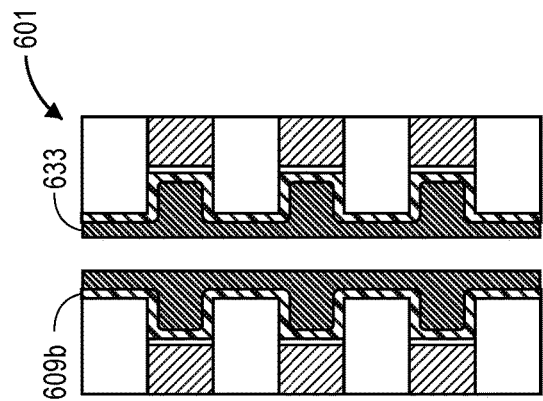
Figure 6E:
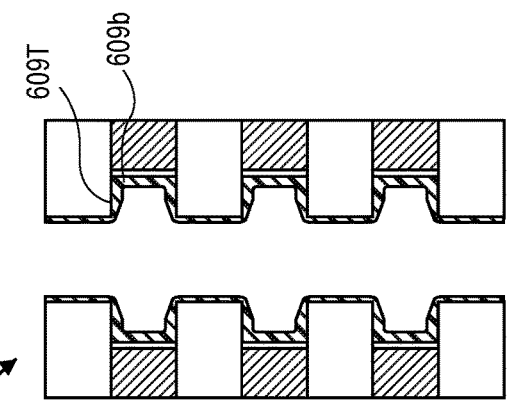

Referring again to FIG. 5, the process 500 includes forming one or more dielectric layers in each of the recesses, at 506. The example illustrated in FIGS. 6D-6K shows a process of forming a multi-layer dielectric layer with tapered edges. Other processes may differ (e.g., other processes may include fewer or more dielectric layers and/or include non-tapered edges). FIG. 6D illustrates the substrate 601 after formation of a first dielectric layer 609a. In one example, forming the first dielectric layer 609a involves growing or depositing a first interpoly dielectric (IPD) layer 609a of the multi-layer dielectric including, e.g., silicon oxide over the polysilicon surface in the recess 660. Thus, the first IPD layer is formed in a "bottom" region or end of each cavity 660. In one example, the first dielectric layer 609a may be silicon oxide grown from polysilicon. In one example, as shown in FIG. 6E, the process can next involve growing or depositing a second dielectric layer 609b of a multi-layer dielectric over a surface of the first dielectric 609a in the recesses 660. In the illustrated example, the second dielectric layer 609b is formed not only in the recesses 660, but also over surfaces of the insulating layers 675 exposed in the hole 603. In one example, forming the second dielectric layer 609b may include growing or depositing a silicon nitride layer. FIG. 6E illustrates the substrate 601 after deposition of a second dielectric layer 609b.

Figure 6F:
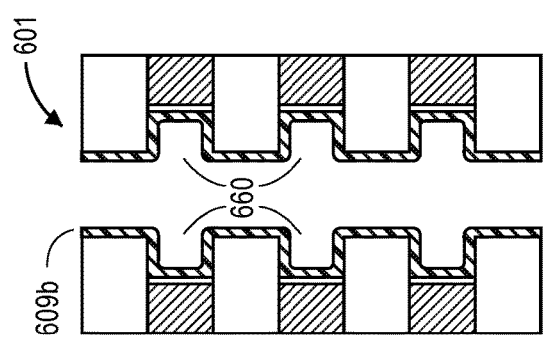
Figure 6G:
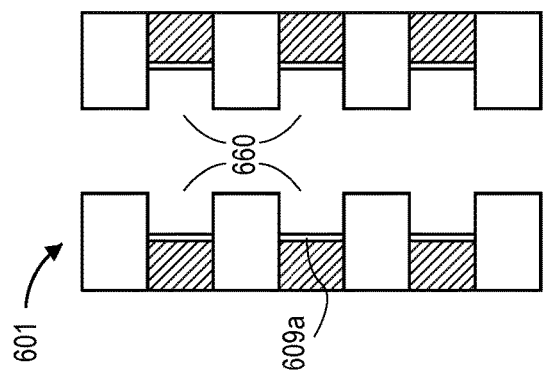

In the illustrated example, as shown in FIG. 6F, the process includes growing or depositing a sacrificial protection layer 633 over the second dielectric layer 609b. Next, in one example and as shown in FIG. 6G, the process involves etching the sacrificial protection layer 633 to leave a portion of sacrificial protection layer 633 in a bottom of cavity regions 660 over the second dielectric layer 609b. Chemistries that provide high etch removal selectivity may be used to etch the sacrificial protection layer 633. Etching the sacrificial protection layer 633 can enable exposing edges of the second dielectric layer 609b while protecting the second dielectric layer 609b in the recesses 660.

Figure 6H:
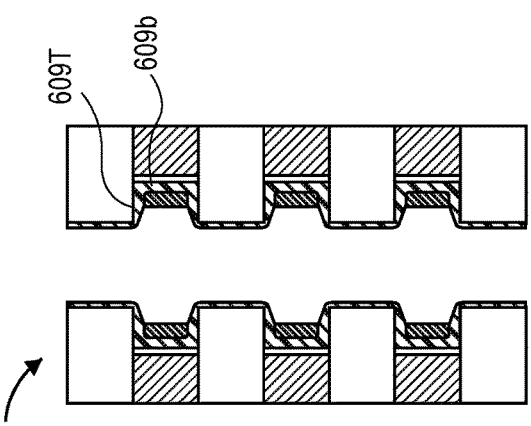

In one example and as shown in FIG. 6H, the process includes selectively oxidizing or etching portions of the second dielectric layer 609b to form a tapered edge 609T. As illustrated in FIG. 6H, the edges 609T of the second dielectric layer 609b are tapered at the opening or corner of the recesses 660. The tapered features 609T may enable formation of a tapered feature of a floating gate, as described below. Other processes may not involve formation of tapered features.

Figure 6I:
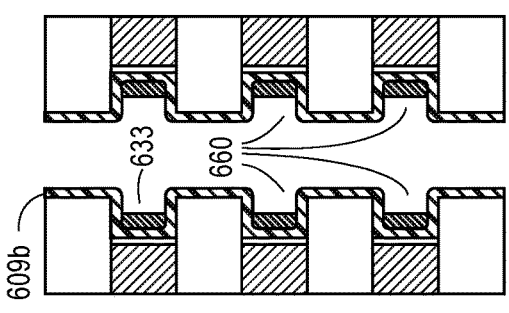

In one example and as shown in FIG. 6I, the remaining portions of the sacrificial protection layer 633 are removed (e.g., via etching), exposing the second dielectric layer 609b having the tapered edge 609T. In one example, and as shown in FIG. 6J, the process includes removing the portions of the second dielectric layer 609b that cover the exposed surfaces of the insulator layers 675 in the hole 603. The process may further include growing an additional (third) layer 609c of the multi-layer dielectric to substantially insulate the second dielectric layer 609b. In one example, the third dielectric layer includes an oxide (e.g., silicon oxide), and may be formed from the same material as the first dielectric layer 609a. Thus, in the illustrated example a multi-layer IPD (such as an oxide-nitride-oxide (ONO)) is formed in the recesses adjacent to the control gate regions such that the multi-layer dielectric in the completed device is disposed between the control gates and the floating gates. In one example, one or more of the dielectric layers include a high-K dielectric.

In one example, after forming the layers of dielectric material, a barrier layer may be formed over the dielectric layer(s). For example, as shown in FIG. 6K, the process may include depositing an additional layer 615 ("barrier layer 615") over the multi-layer dielectric and over both alternating layers of conductor 650 and insulator 675. In one example, the additional layer 615 includes silicon nitride. In one such example, the layer 615 is deposited via an atomic layer deposition. The additional layer 615 could also be considered a fourth dielectric layer of the inter-poly dielectric.

Referring again to FIG. 5, after forming the one or more layers of dielectric material and the barrier layer 615, the process involves forming floating gates over or adjacent to the dielectric layers, at operation 508. In one example, forming the floating gates involves the operations described in accordance with FIGS. 6L-6O.

In one example, the process includes depositing a floating gate material 605 from which the floating gates are formed. In one example, the floating gate material 605 is polysilicon. In one example, the polysilicon 605 is deposited as a conformal layer over the exposed surfaces in the holes 603. Thus, in the illustrated example, the polysilicon material 605 is deposited over the barrier layer 615 over the insulating layers 675 and in the recesses. The polysilicon material 605 is deposited to have a curvature that follows the topology of the recesses into which it is deposited. In another example, a thicker layer of polysilicon may be deposited so that it does not conform to the underlying topology formed by the recesses. Next, in the example illustrated in FIG. 6M, a partial etchback of the polysilicon material 605 removes the polysilicon material adjacent to the insulator material 675 to form discrete floating gates 605a, 605b, and 605c. Additionally, some or all of barrier layer 615 adjacent to the insulator layers 675 and between adjacent vertical floating gates may be removed to achieve silicon nitride isolation between adjacent memory cells. The floating gates 605a, 605b, and 605c have a channel-facing surface 621 that is concave, and which has a radius of curvature. Regardless of whether the floating gate material 605 is deposited as a conformal layer, the deposition and/or etch of the floating gate material 605 produce a storage node having a radius of curvature that is comparable to or less than the radius of the channel. In the illustrated example, the surface of the floating gates 605a, 605b, and 605c facing the control gates 600a, 600b, and 600c is straight.

In one example and as shown in FIG. 6N, a tunnel dielectric layer 612 is formed over the floating gates. In one example, the tunnel dielectric layer 612 is a silicon oxide that may be grown on the polysilicon material of the floating gates 605a, 605b, and 605c.

Referring again to FIG. 5, after forming the floating gates, the process 500 involves forming a channel in the hole, at 510. Forming the channel can involve depositing a conductive film over the tunnel dielectric layer 612 and depositing a dielectric material over the conductive film to fill the hole. FIG. 6O illustrates the substrate after deposition of a channel semiconductor film 611. A dielectric fill 611a may then complete formation of the structure. Thus, the process illustrated in FIG. 5 and FIGS. 6A-6O illustrate one process for forming floating gates having a radius of curvature that is the same or less than the radius of the channel. The floating gate formed via the process 500 may be the same as, or similar to, the floating gate illustrated in FIG. 3A.

FIGS. 7A-7D illustrate a variation of the process 500 of FIG. 5 to form floating gates with radii of curvature on both channel-facing and control gate-facing surfaces. Specifically, the example illustrated in FIGS. 7A-7D modifies the deposition of the conductive layers 650 such that the isotropic etch of those layers creates an additional feature of the storage node surface having the desired radial dimension.

Referring to FIG. 7A, similar to FIG. 6A, the process begins with the formation of a substrate 701 including alternating layers of an insulating material 775 and a conducting material 750. However, the deposition of the conducting material 750 (e.g., polysilicon or other conductor) is controlled to tune the composition profile of the layer 750. In one example, one or more parameters of the deposition process are adjusted to cause the bottom and upper portions 753 of the layer 750 to have a different deposition rate than the middle portion 751 of the layer 750. For example, by adjusting parameters such as temperature, the flow of precursor gases, or other parameters, a layer can be formed that has a different composition at different points in the layer. By tuning the composition profile of the material 750 from bottom up, a faster removal rate can be achieved at either end of the conductor during a subsequent etch to create the desired curvature.

FIG. 7B illustrates the substrate 701 after a pillar hole 703 is etched through the stack. In one example, the hole 703 is for a channel or channel region of a NAND string. Forming the hole 703 in substrate 701 may be accomplished by anisotropic etching of a cylinder-shaped hole or trench through substrate 701 including the stack.

In one example, after etching the high aspect ratio holes 703 in the substrate, recesses 760 are formed in side walls of the hole 703 at the layers 750 of conductive material, as illustrated in FIG. 7C. Forming the recesses may include, for example, isotropic etching of the conductor layer 750. Because the composition profile of the layers 750 were controlled to have higher etch rates towards the top and bottom of the layers, the etch creates a curved profile in the recesses 760. In the illustrated example, the control gate material 708 has a convex surface 713. The convex curvature of the control gate material 708 enables forming concave floating gates having a radius of curvature on the surface facing the control gate.

FIG. 7D illustrates the substrate 701 after additional processing operations, which may be similar to the processing steps described above with respect to FIGS. 5 and 6D-6O. For example, FIG. 7D illustrates the stack after deposition of one or more dielectric layers 709, deposition and etching of the floating gate material 771, deposition of a channel layer 711 and a channel fill 711a. Like FIG. 6O, the example illustrated in FIG. 7D includes floating gates with tapered edges.

As can be seen in FIG. 7D, in addition to the first radius of curvature on the channel-facing surface 771a of the floating gate, the control gate-facing surface 771b also has a second radius of curvature. The resulting floating gate configuration in FIG. 7D is similar to or the same as the floating gate in FIG. 3B. The second radius of curvature (R2)

may be similar to, less than, or greater than the first radius of curvature (R1). In one example, the choice of R1 and R2 relative to the channel radius (R_pillar) depends on geometric and device material parameters. In one example, both the first and second radii of curvature of the floating gates are less than or equal to the radius of the channel. The second radius of curvature can enhance the Vt window by optimizing the ratio of blocking layer leakage to tunnelling layer leakage under programming operation bias condition.

Figure 8A:
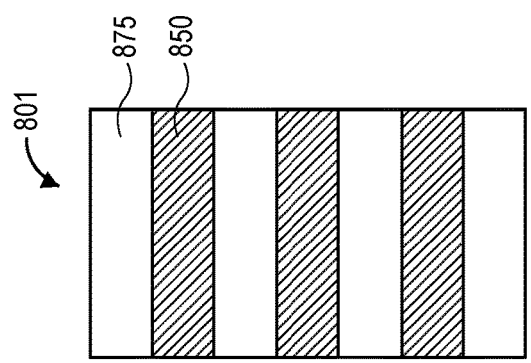
FIGS. 8A-8N illustrate cross-sectional side views of various stages of a process of forming an integrated circuit with a memory node having a radius of curvature.
Figure 8B:
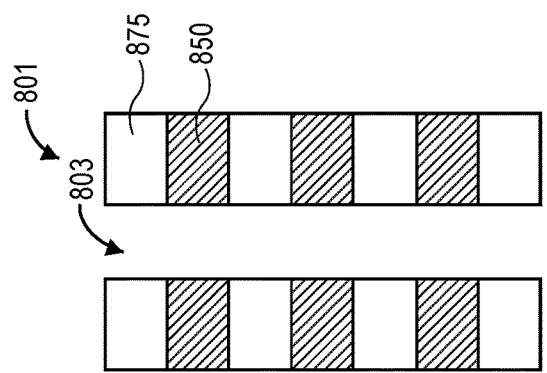
Figure 8C:
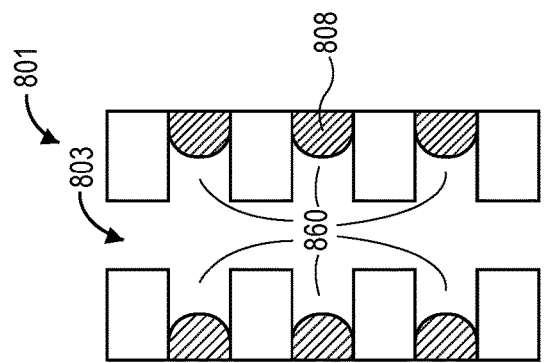
Figure 8D:
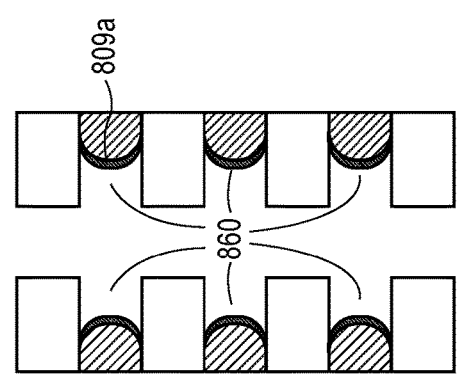
Figure 8E:
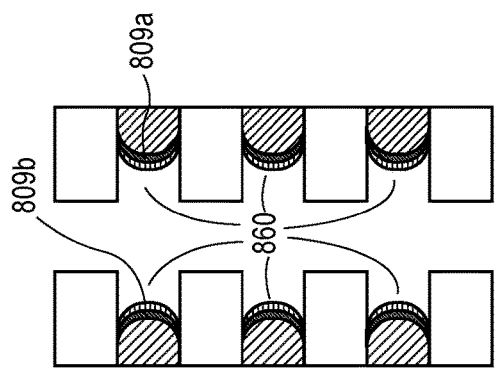
Figure 8F:
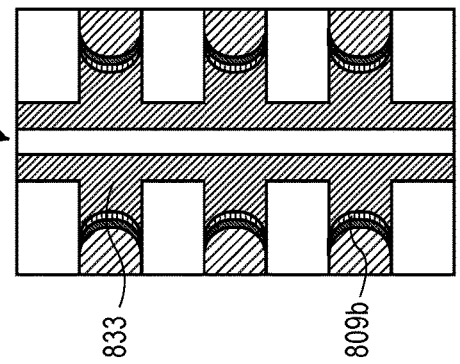
Figure 8H:
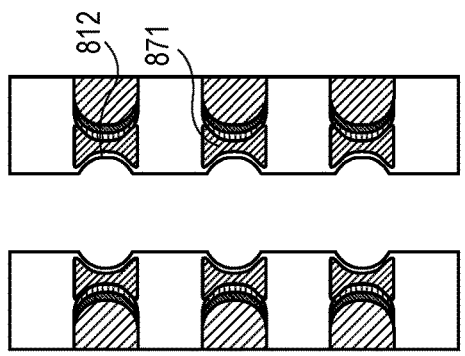
Figure 8J:
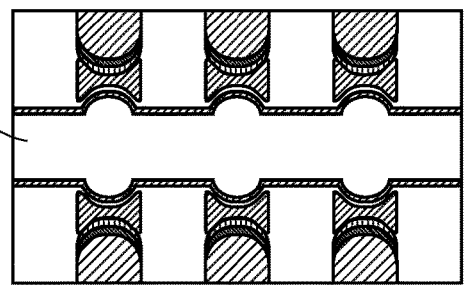
Figure 8G:
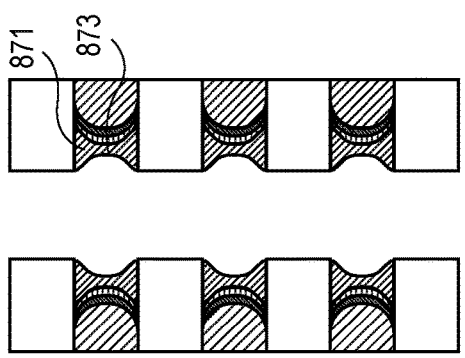
Figure 8I:
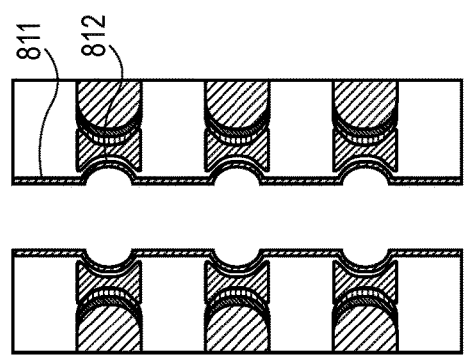
Figure 8L:
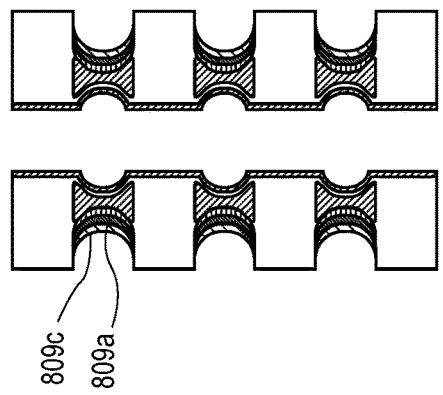
Figure 8N:
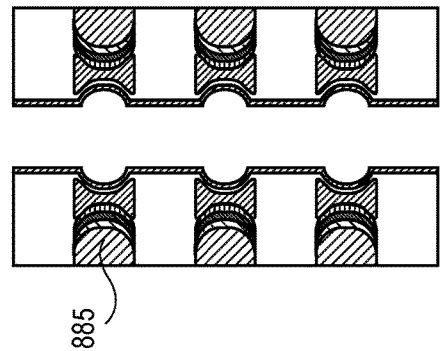

FIGS. 8A-8N illustrate another variation of the process 500 of FIG. 5 to form floating gates with radii of curvature on both the channel-facing and control gate-facing surfaces and non-tapered edges.

FIG. 8A is similar to FIG. 7A in that it illustrates a substrate 801 including alternating layers of an insulating material 875 and a conducting material 850. Like in FIG. 7A, the deposition of the conducting material 850 (e.g., polysilicon or other conductor) is controlled to tune the composition profile of the layer 850. By tuning the composition profile of the material 850 from bottom up, a faster removal rate can be achieved at either end of the conductor during a subsequent etch to create the desired curvature.

FIG. 8B illustrates the substrate 801 after a pillar hole 803 is etched through the stack. In one example, the hole 803 is for a channel of a NAND string. Forming the hole 803 in substrate 801 may be accomplished by anisotropic etching of a cylinder-shaped hole or trench through substrate 801 including the stack. In one example, after etching the high aspect ratio holes in the substrate, recesses 860 are formed in side walls of the hole 803 at the layers 850 of conductive material, as illustrated in FIG. 8C. Forming the recesses 860 may include, for example, isotropic etching of the conductor layer 850. FIG. 8C shows an example of etching the layers 850 of conductive material to form recesses with convex surfaces (causing the control gate material 808 to have a convex surface), however, other processes may involve etching the layers 850 of conductive material to form recesses with straight non-curved surfaces. Forming recesses with convex surfaces may result in a floating gate structure with curvature on both channel-facing and control-gate facing surfaces, similar to, or the same as, the floating gate illustrated in FIG. 3D. Forming recesses with a straight non-curved profile may result in a floating gate with a straight surface on its control-gate facing side, similar to, or the same as, the floating gate illustrated in FIG. 3C.

After etching the conductive layers 850 to form the recesses 860, one or more dielectric layers are formed on the conductive layer surface in each of the recesses. FIG. 8D illustrates selective deposition of a nitride layer 809a over the conductive layer surface in each of the recesses. Instead of conformally depositing a silicon nitride layer that coats the entire topography in the hole 803, the nitride is selectively deposited only on the conductive layers 850. In one example, the conductive layers 850 are polysilicon and the nitride layer 809a is deposited on hydrogen terminated polysilicon surfaces. In one example, the nitride layer 809a is deposited via atomic layer deposition (ALD) deposition which can be deposited on polysilicon selective to oxide. In one such example, deposition of the nitride layer 809a involves multiple cycles of substrate thermal and precursor treatments to achieve the desired selectivity.

Figure 8K:
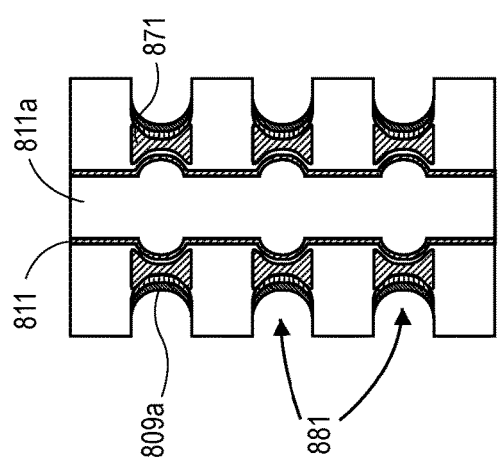

In the illustrated example, the nitride layer 809a is one of multiple dielectric layers of a multi-layer IPD. One way to form the multi-layer IPD is with a two-step deposition in which the layer is partially formed by a thin layer of nitride via area selective deposition (e.g., as described above with respect to FIG. 8D) and completed with a subsequently deposited film deposition via a conformal ALD (as described below with respect to FIG. 8K). Thus, the deposition of the nitride layer 809a can be a partial deposition to be completed post sacrificial layer removal (e.g., after removal of the conductive material 850 to expose back surfaces of the nitride layer 809a). In one example, the area selective deposition of the nitride layer 809a is followed by partial nitride etch-back to compensate for lower deposition selectivity (e.g., to maintain a low thermal budget for the array formation).

Referring to FIG. 8E, after deposition of the nitride layers 809a, a second dielectric layer 809b may be deposited over the nitride layers 809a in the recesses 860. In one example, the second dielectric layer 809b is an oxide layer. After deposition of the oxide layer 809b, one or more additional dielectric layers of the multi-layer IPD may be deposited.

Referring to FIG. 8F, a floating gate material (such as polysilicon) is deposited over the oxide layers 809b in the hole 803. The floating gate material may or may not be deposited as a layer that conforms to the underlying topology. The polysilicon layer 833 illustrated in FIG. 8F does not conform to the underlying topology in the hole 803. However, the process may instead involve forming a conformal polysilicon layer. After deposition of the floating gate material 833, the floating gate material 833 is etched to form isolated floating gates 871, as illustrated in FIG. 8G. The etch of the floating gate material 833 may also cause the radius of curvature on the channel-facing surface 873 of the floating gates 871. After etching the floating gate material, the tunnel dielectric layer 812 is deposited over the floating gates 871, as illustrated in FIG. 8H. After formation of the tunnel dielectric layer 812, a conductive channel layer 811 is formed over the tunnel dielectric layer 812, as illustrated in FIG. 8I. In the example illustrated in FIG. 8J, the hole 803 is then filled with an insulator, such as an oxide. The operations discussed with respect to FIGS. 8F-8J (including deposition and etch of the floating gate material, tunnel dielectric deposition, channel deposition, and fill) can be the same as or similar to those operations discussed above with respect to FIGS. 6L-6O.

FIGS. 8K-8N illustrate an example of a gate replacement flow process. In one example, the gate replacement is performed after formation of the floating gates 871 and channel film 811. In order to etch the conductive layers of the stack, slits or trenches on either side of the hole 803 can be etched. The layers of conductive material adjacent to the dielectric layer 809a can then be removed via an etch process in the slits. In one example, the removal of the conductive material creates recesses 881 or voids and exposes back surfaces of the nitride layers 809a. Once the nitride layers 809a are exposed, one or more additional dielectric layers may be formed. For example, FIG. 8L illustrates formation of an oxide layer 809c over the nitride layer 809a.

Figure 8M:
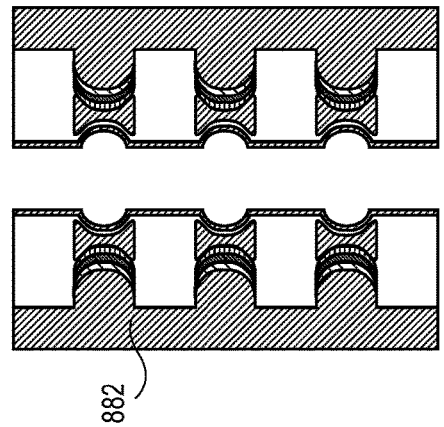

FIG. 8M illustrates the substrate after a conductive material 882 is deposited in the recesses 881 via the slits. The conductive material 882 is for formation of the control gates and can be any suitable conductive material such as polysilicon (which may be doped), a metal, or other suitable conductive material. The conductive material 882 is then etched via the slits to form isolated control gates 885, as shown in FIG. 8N. Thus, the example illustrated in FIGS. 8A-8N shows a ways to modify the process 500 of FIG. 5 to obtain a floating gate with non-tapered edges and radii of curvature on both a channel-facing and a control gate facing surface, such as illustrated in FIG. 3D, discussed above.

The process 500 of FIG. 5 and the variations discussed above are examples for forming floating gates having one or more surfaces with a radius of curvature. Charge trap storage nodes can also benefit from having a radius of curvature on a channel-facing surface.

Figure 9:
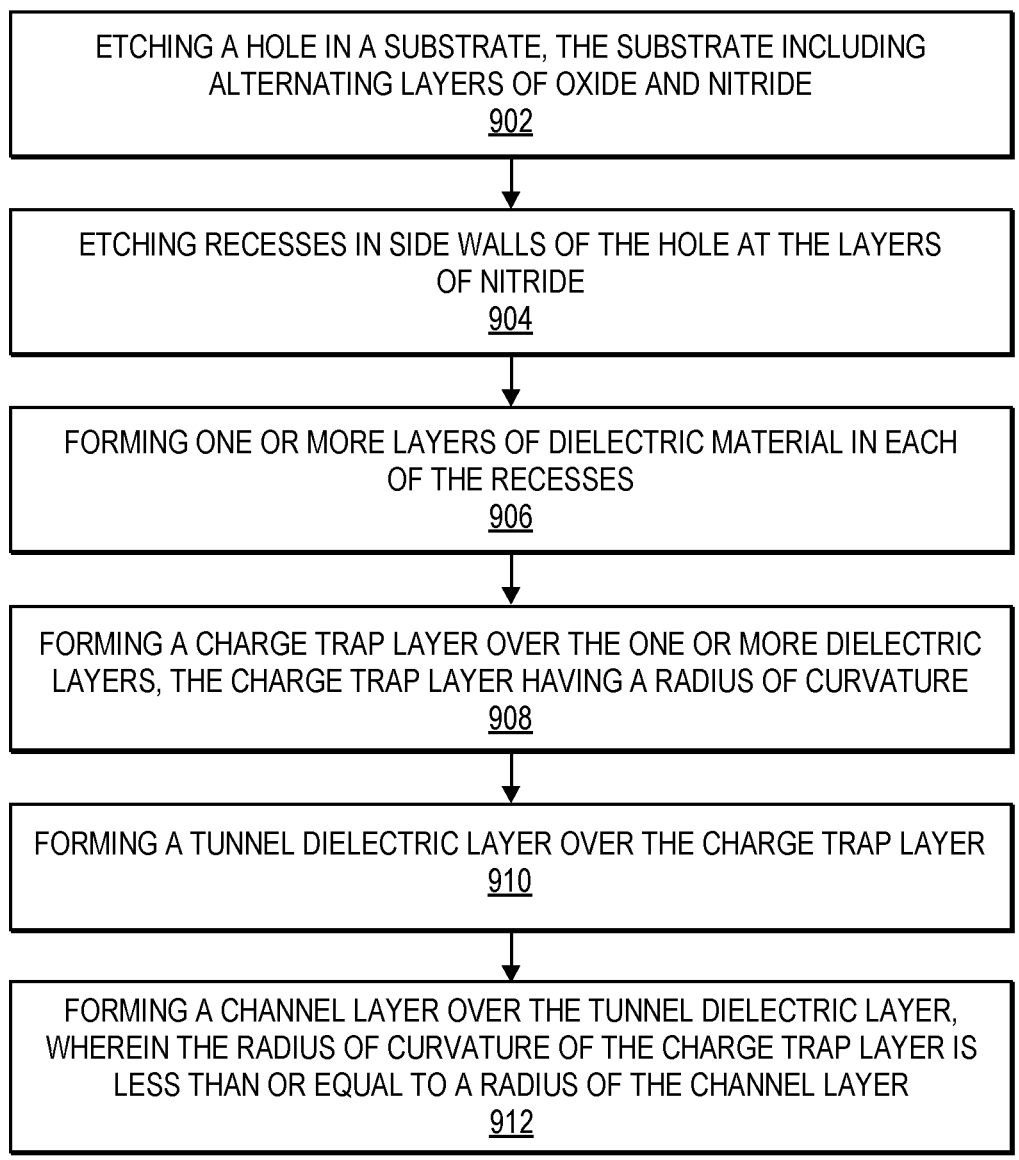
FIG. 9 is a flow diagram of an example of a process of forming an integrated circuit with memory nodes having radii of curvature.

FIG. 9 is a flow diagram of an example of a process 900 of forming an integrated circuit with a charge trap layer having a radius of curvature. The process 900 is one example of how to achieve charge trap features having a radius of curvature that is comparable to or less than the channel radius. FIGS. 10A-10F illustrate cross-sectional side views of various stages associated with process 900. FIG. 9 and FIGS. 10A-10F are discussed together below.

Figure 10A:
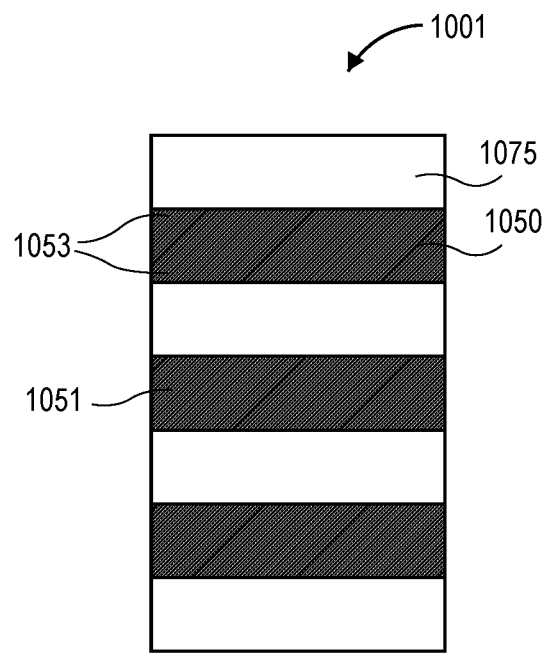
FIGS. 10A-10F illustrate cross-sectional side views of various stages of a process of forming an integrated circuit with a memory node having a radius of curvature.

Turning first to FIG. 9, the process 900 involves processing a substrate, such as the substrate 1001 illustrated in FIG. 10A. FIG. 10A illustrates a cross-sectional side view of a substrate 1001 including alternating layers 1050 and 1075. In one example, the alternating layers of the substrate are layers of an oxide 1075 and a nitride 1050. In one example, forming the substrate 1001 involves depositing alternating layers of a nitride 1050 and an oxide 1075 to form a stack. The oxide may include silicon oxide, or other suitable oxide (e.g., metal oxides such as aluminum oxide). The nitride may include silicon nitride or other suitable nitride. In one example, forming the stack involves chemical vapor deposition (CVD) (such as low-pressure CVD (LPCVD)) deposited oxide and nitride.

In one example, the deposition of the nitride material 1050 is controlled to tune the composition profile of the layer 1050. In one example, one or more parameters of the deposition process are adjusted to cause the bottom and upper portions 1053 of the layer 1050 to have a different deposition rate than at the middle portion 1051 of the layer 1050. For example, by adjusting parameters such as temperature, the flow of precursor gases, or other parameters, a layer can be formed that has a different composition at different points in the layer. By tuning the composition profile of the material 1050 from bottom up, a faster removal rate can be achieved at the middle of the nitride layer than at the top and bottom of the nitride layer during a subsequent etch to create the desired curvature. Additionally, although the layers 1050 and 1075 are illustrated as having the same thickness, some implementations may include different thicknesses for the layers 1075 and 1050. In some implementations, the thickness of the layers may be different based on where they are located in the stack (e.g., bottom or top of the stack).

Figure 10B:
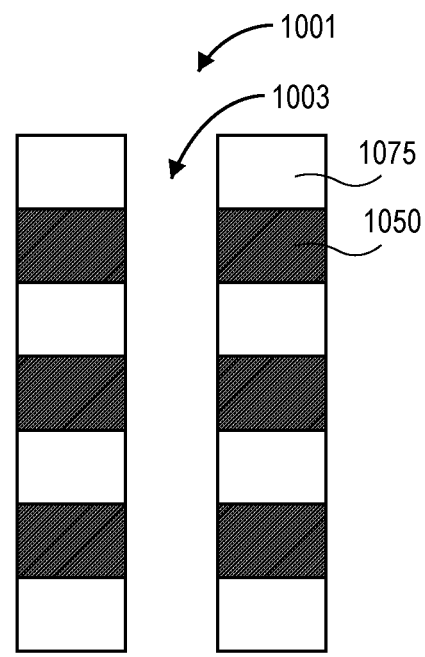

The process 900 involves etching a hole in a substrate, at 902. FIG. 10B illustrates a cross-sectional side view of the substrate 1001 with a hole 1003 etched through the alternating layers 1050 and 1075 of the substrate 1001. In one example, the hole 1003 is for a channel of a NAND string. Forming the hole 1003 in substrate 1001 may be accomplished by anisotropic etching of a cylinder-shaped hole or trench through substrate 1001 including the stack of alternating oxide 1075 and nitride 1050. Typically, the holes 1003 for channel formation are narrow and deep or long (e.g., have a high aspect ratio).

Figure 10C:
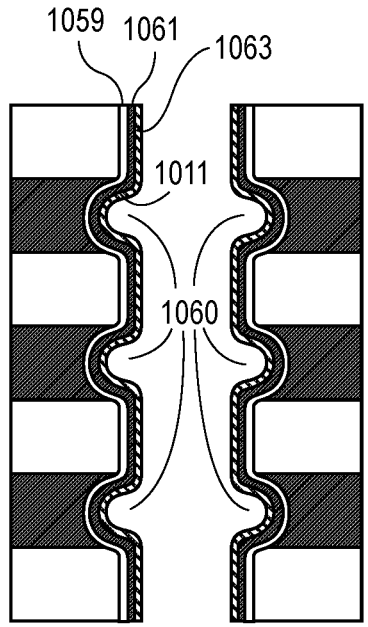

Referring to FIG. 9, after etching the high aspect ratio holes in the substrate, the process 900 involves etching recesses in side walls of the holes at the layers of nitride, at 904. FIG. 10C illustrates the substrate 1001 after recesses 1060 or cavities have been etched into the side walls of the holes 1003 and after deposition of multiple layers in the recesses and on side walls of the holes. In the illustrated example, the recesses 1060 are formed at or in the nitride layers 1050 of the stack. Etching the recesses may include, for example, isotropic etching of the nitride layer 1050. Because the composition profile of the layers 1050 was controlled to have a higher etch rate at the middle 1051 of the layers 1050 relative to the etch rate towards the top and bottom of the layers 1050, the etch creates a curved profile in the recesses 1060. In the illustrated example, etching the recesses causes the nitride layers 1050 to have a concave shape. A conventional charge trap process does not involve etching recesses (such as the recesses 1060 formed on sidewalls of the channel holes). In contrast to conventional charge trap memory devices, recesses 1060 are formed in the channel holes, which enable formation of a charge trap layer with a radius of curvature, as explained below.

Referring to FIG. 9, after etching the recesses 1060, the process 900 involves forming one or more layers of dielectric material in each of the recesses, at 906. FIG. 10C illustrates an example of one or more dielectric layers 1059 deposited in the curved recesses 1060 and on side walls of the hole 1003. Although a single layer 1059 is illustrated in FIG. 10C, more than one dielectric layer may be deposited in the recesses 1060. In one example, the dielectric layer 1059 is a multi-layer blocking dielectric. For example, the dielectric layer 1059 may include multiple oxide and/or nitride layers. The process 900 illustrates formation of the one or more dielectric layers 1059 from the "front side" through the channel holes. However, one or more dielectric layers may be formed from the "back side" through subsequently etched trenches (e.g., for gate replacement) instead of, or in addition to, forming dielectric layers via the channel holes.

Referring again to FIG. 9, the process 900 includes forming a charge trap layer over the dielectric layer(s), at 908. The charge trap layer may be silicon nitride or other material suitable for forming a charge trap. Charge trap layers are typically insulating layers in which charge can be trapped or stored. The charge trap layer in the example illustrated in FIG. 10C is continuous (e.g., not isolated) between vertically adjacent cells. For example, the charge trap layer 1061 is not isolated between vertically adjacent recesses 1060. The charge trap layer includes a surface having a radius of curvature. For example, the charge trap layer is deposited (and may also be etched in some implementations) to form a conformal layer over the topology of the hole 1003. Thus, the charge trap layer is deposited in the concave curved recesses 1060, resulting in the charge trap layer 1061 having curved shape. Specifically, a channel-facing surface 1011 between the insulating layers 1075 has a radius of curvature. The radius of curvature of the channel-facing surface 1011 is less than or equal to a radius of the channel.

Figure 10D:
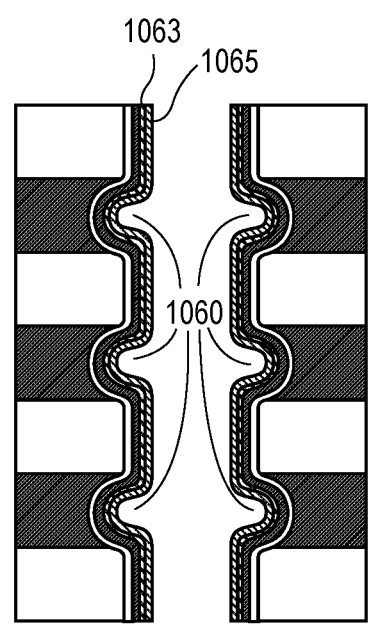

Referring to FIG. 9, after formation of the charge trap layer, the process 900 includes forming a tunnel dielectric layer over the charge trap layer, at 910. FIG. 10C illustrates a tunnel dielectric layer 1063 over the charge trap layer 1061. The tunnel dielectric layer 1063 in the illustrated example is a conformal layer over the chare trap layer 1061. The tunnel dielectric layer may be in accordance with the tunnel dielectric layers discussed above. Referring again to FIG. 9, after formation of the tunnel dielectric layer, the process involves forming a channel film over or adjacent to the tunnel dielectric layer, at 912. For example, FIG. 10D illustrates the stack after deposition of a channel film 1065 over the tunnel dielectric layer 1063. In the illustrated example, the channel is formed as a conformal film that follows the contours of the hole 1003. Thus, the channel layer 1065 has a different radius at different points along its length. The radius of the channel as measured at the layers of oxide 1075 have a radius that is smaller than the radius of curvature of the charge trap layer 1061. The charge trap layer formed via the process in FIG. 9 may be the same as or similar to the charge trap layer of FIG. 3D. For example, referring to FIG. 3D, the radius of curvature R1 of the charge trap layer 1061 is less than or equal to the channel radius R_pillar. In one example, the radius of curvature R1 is less than the channel radius R_Pillar.

Figure 10E:
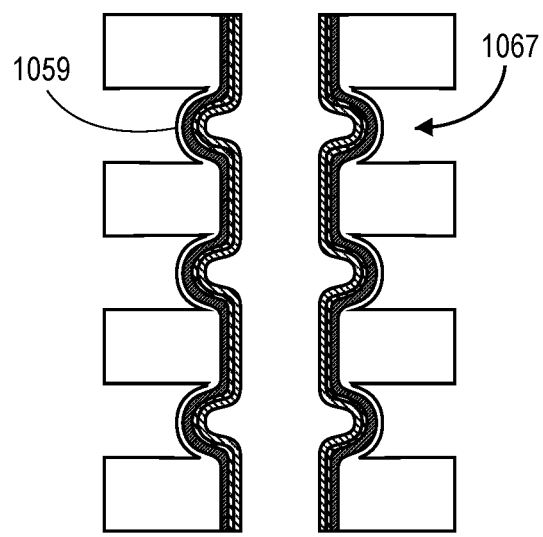

After forming the channel 1065, a gate replacement flow may be performed to complete formation of the control gates. For example, as shown in FIG. 10E, the sacrificial nitride layers 1050 can be removed via an etching process. In one such example, trenches or slits (not shown) are etched between adjacent holes 1003 to enable removal of the nitride layers 1050. After removal of the nitride layers 1050, the one or more dielectric layers 1059 are exposed in openings 1067. The openings 1067 can then be filled with one or more conductive materials and/or dielectric layers.

Figure 10F:
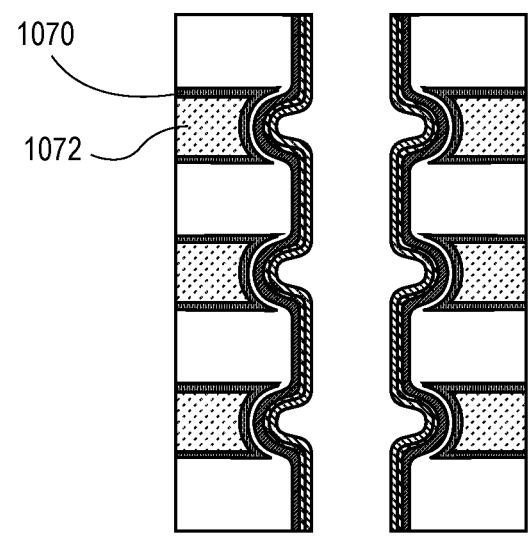

As mentioned above, one or more dielectric layers (e.g., one or more of layers of a multi-layer blocking dielectric) may be formed from the backside. For example, FIG. 10F illustrates the stack after deposition of a barrier layer 1070 in the openings 1067 and a metal layer 1072 over the barrier layer 1070. In one example, the barrier layer is a dielectric layer (e.g., a metal nitride such as titanium nitride or other dielectric material). The metal layer 1072 may includes a low resistance metal such as tungsten, molybdenum, or ruthenium, or other suitable conductor. Thus, FIG. 9 illustrates one example of a process for forming a memory device with a continuous charge trap layer having a radius of curvature. The charge trap feature formed via the process 900 may be the same as, or similar to, the charge trap feature illustrated in FIG. 3E.

Figure 11:
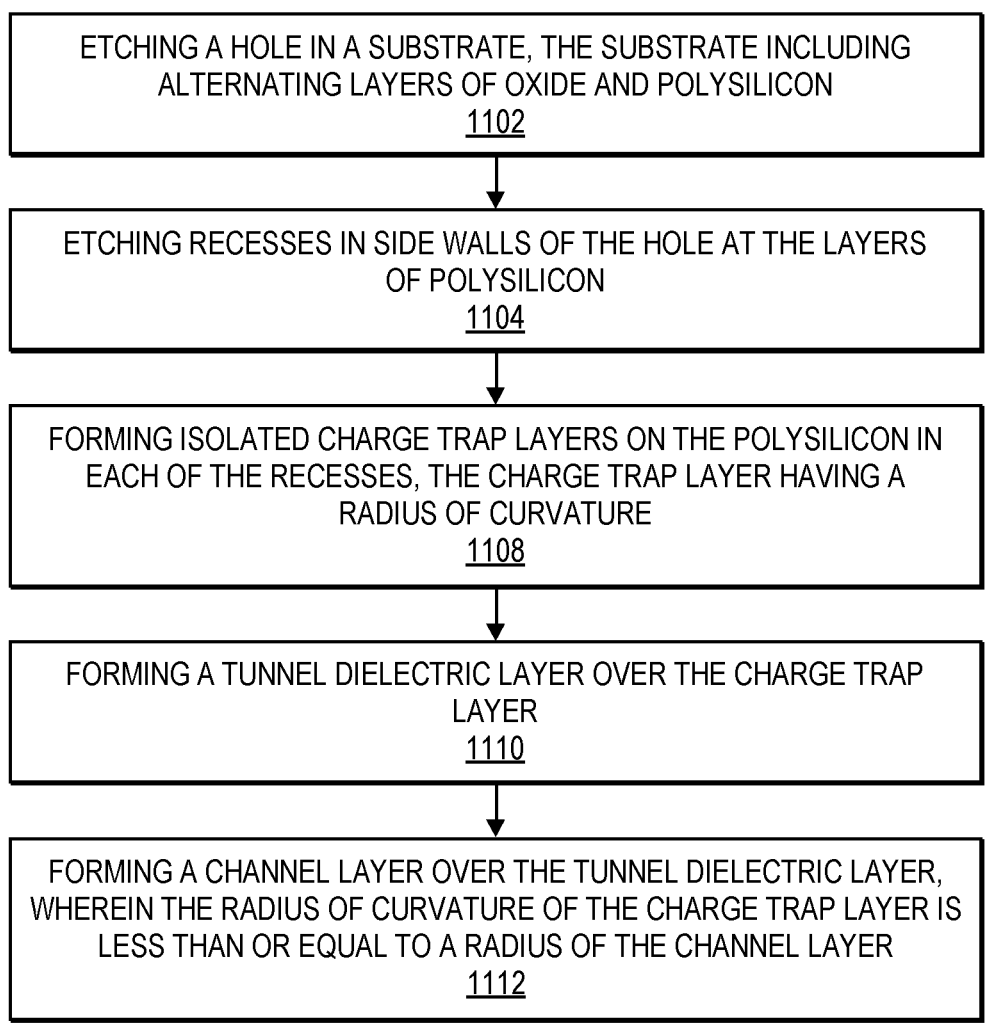
FIG. 11 is a flow diagram of an example of a process of forming an integrated circuit with memory nodes having radii of curvature.

FIG. 11 is a flow diagram of another example of a process for forming an integrated circuit with chare trap layers having a radius of curvature. The process 1100 is one example of how to achieve charge trap features having a radius of curvature that is comparable to or less than the channel radius. The charge trap features formed via the process 1100 are similar to those formed via the process 900 of FIG. 9, however, the charge trap layers formed via the process 1100 are vertically isolated from one another instead of continuous. FIGS. 12A-12G illustrate cross-sectional side views of various stages associated with process 1100. FIG. 11 and FIGS. 12A-12G are discussed together below.

Figure 12A:
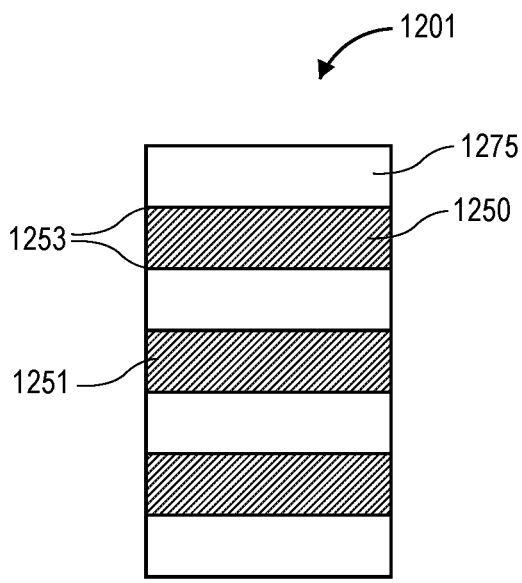
FIGS. 12A-12G illustrate cross-sectional side views of various stages of a process of forming an integrated circuit with a memory node having a radius of curvature.

The process 1100 of FIG. 11 involves processing a substrate, such as the substrate 1201 illustrated in FIG. 12A. FIG. 12A illustrates a cross-sectional side view of a substrate 1201 including alternating layers 1250 and 1275. In one example, the alternating layers of the substrate are layers of an oxide 1275 and a polysilicon 1250. In one example, forming the substrate 1201 involves depositing alternating layers of a polysilicon 1250 and an oxide 1275 to form a stack. The oxide may include silicon oxide, or other suitable oxide (e.g., metal oxides such as aluminum oxide). In one example, forming the stack involves chemical vapor deposition (CVD) (such as low-pressure CVD (LPCVD)) deposited oxide and polysilicon.

In one example, the deposition of the polysilicon material 1250 is controlled to tune the composition profile of the layer 1250. In one example, one or more parameters of the deposition process are adjusted to cause the bottom and upper portions 1253 of the layer 1250 to have a different deposition rate than at the middle portion 1251 of the layer 1250. For example, by adjusting parameters such as temperature, the flow of precursor gases, or other parameters, a layer can be formed that has a different composition at different points in the layer. By tuning the composition profile of the material 1250 from bottom up, a faster removal rate can be achieved at the middle of the polysilicon layer than at the top and bottom of the polysilicon layer during a subsequent etch to create the desired curvature. Additionally, although the layers 1250 and 1275 are illustrated as having the same thickness, some implementations may including different thicknesses for the layers 1275 and 1250. In some implementations, the thickness of the layers may be different based on where they are located in the stack (e.g., bottom or top of the stack).

Figure 12B:
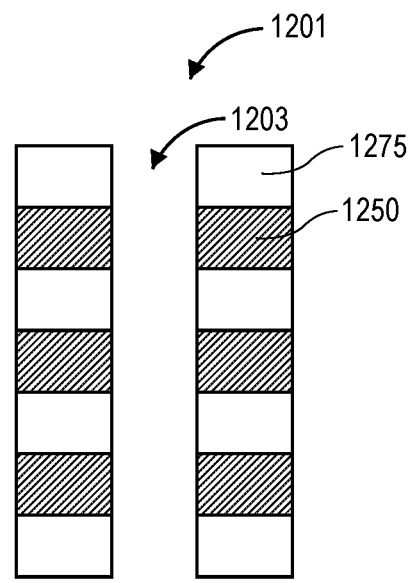

The process 1100 involves etching a hole in a substrate, at 1102. FIG. 12B illustrates a cross-sectional side view of the substrate 1201 with a hole 1203 etched through the alternating layers 1250 and 1275 of the substrate 1201. In one example, the hole 1203 is for a channel of a NAND string. Forming the hole 1203 in substrate 1201 may be accomplished by anisotropic etching of a cylinder-shaped hole or trench through substrate 1201 including the stack of alternating oxide 1275 and polysilicon 1250. Typically, the holes 1203 for channel formation are narrow and deep or long (e.g., have a high aspect ratio).

Figure 12C:
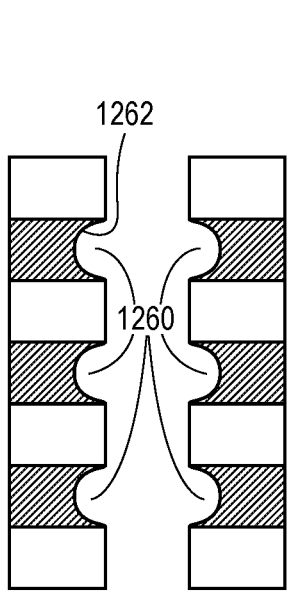

Referring to FIG. 11, after etching the high aspect ratio holes in the substrate, the process 1100 involves etching recesses in side walls of the holes at the layers of polysilicon, at 1104. FIG. 12C illustrates the substrate 1201 after recesses 1260 or cavities have been etched into the side walls of the holes 1203. In the illustrated example, the recesses 1260 are formed at or in the polysilicon layers 1250 of the stack. Etching the recesses may include, for example, isotropic etching of the conductor layer 1250. Because the composition profile of the layers 1250 was controlled to have a higher etch rate at the middle 1251 of the layers 1250 relative to the etch rate towards the top and bottom of the layers 1250, the etch creates a curved profile in the recesses 1260. As mentioned above, a conventional charge trap process does not involve etching recesses (such as the recesses 1260 formed on sidewalls of the channel holes). In contrast to conventional charge trap memory devices, recesses 1260 are formed in the channel holes, which enable formation of a charge trap layer with a radius of curvature, as explained below. After etching the recesses, the exposed polysilicon surfaces in the recesses may be treated (e.g., with hydrogen) prior to deposition of the charge trap layer.

Figure 12D:
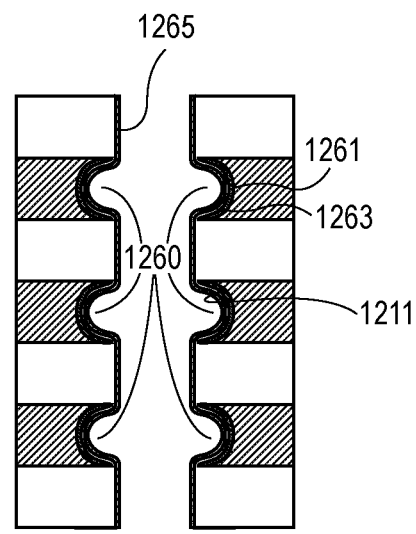

Referring again to FIG. 11, isolated charge trap layers are then formed on the polysilicon in each of the recesses, at 1108. FIG. 12D illustrates the stack after deposition of the charge trap layers 1261. In one example, depositing the isolated charge trap layers 1261 involves ALD deposition of silicon nitride or other suitable high dielectric constant material capable of area-selective deposition (e.g., hafnium oxide). The presence of polysilicon in the stack enables the selected deposition of nitride only on the exposed polysilicon surfaces 1262 in the recesses 1260, thus forming charge trap layers that are vertically isolated from one another. The example in FIG. 12D illustrates a highly selective deposition process that deposits the nitride layer 1261 only on the polysilicon surfaces 1262. However, a less selective process may also be used. In one such example, after deposition of the nitride layer 1261, nitride may also be deposited on side walls of the hole 1203 in addition to in the recesses 1260. In one such example, the process includes an etch back of the nitride on the side walls at the layers of oxide 1275.

Referring again to FIG. 11, after forming the charge trap layers, a tunnel dielectric layer is formed over the charge trap layers, at 1110. After forming the tunnel dielectric layer, a channel layer is formed over the tunnel dielectric layer, at 1112. FIG. 12D illustrates the stack after formation of both a tunnel dielectric layer 1263 and a channel layer 1265. The tunnel dielectric layer 1263 can be similar to, or the same as, the dielectric layer 1063 described above with respect to FIG. 10D. The channel layer 1265 can be similar to, or the same as, the channel layer 1065 of FIG. 10D, described above. The charge trap layer formed via the process 1100 of FIG. 11 can be the same as, or similar to, the charge trap layer of FIG. 3E. In one example, a channel-facing surface 1211 of the charge trap layer between the insulating layers 1275 has a radius of curvature that is less than or equal to a radius of the channel layer 1265. For example, referring to FIG. 3E, the radius of curvature R1 is less than or equal to the radius of the channel R_pillar. In one example, the radius of curvature R1 is less than the radius of the channel R_pillar.

Figure 12E:
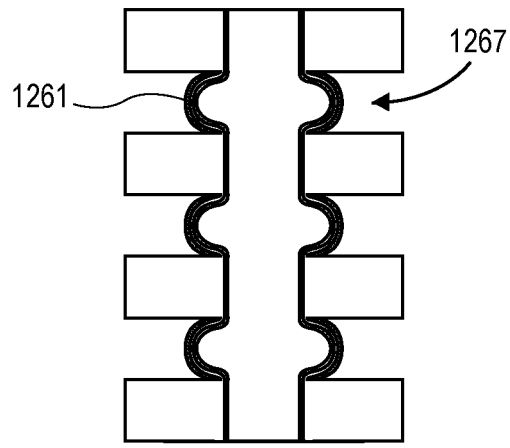
Figure 12F:
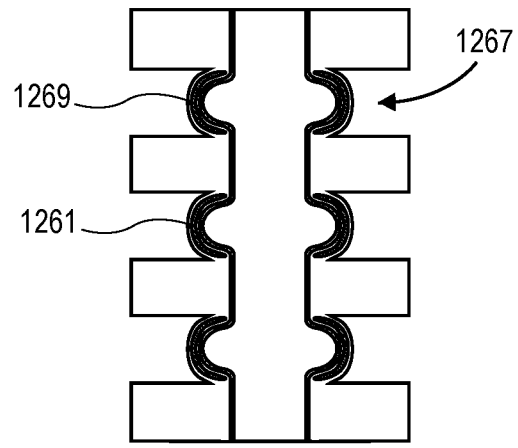
Figure 12G:
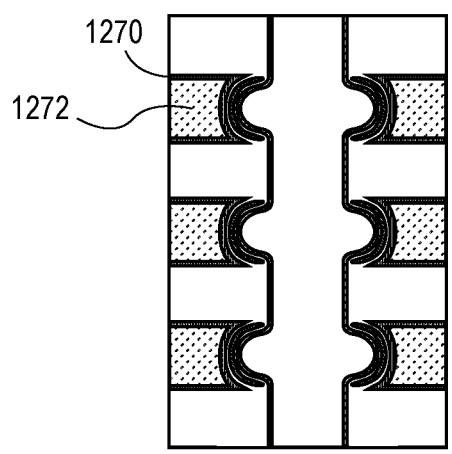

In the illustrated example, a gate replacement flow is also performed after channel formation to form the control gates. As shown in FIG. 12E, the polysilicon layers 1250 can be removed via slits or trenches (not shown) etched between adjacent holes 1203. Removal of the polysilicon layers 1250 results in openings 1267 that expose back surfaces of the charge trap layers 1261. After removal of the polysilicon, some processes may involve additional nitride deposition on the nitride layers 1261 via the openings 1267. One or more dielectric layers 1269 can also be formed on the exposed surfaces of the nitride layers 1261 in the openings 1267, as shown in FIG. 12F. Formation of the one or more dielectric layers 1269 can be similar to, or the same as, formation of the dielectric layers 1059 of FIG. 10E. For example, the one or more dielectric layers 1059 may include a multi-layer blocking dielectric. After formation of the one or more dielectric layers, a barrier layer 1270 and metal layer 1272 can be formed in each of the openings 1267, as shown in FIG. 12G. The barrier layer 1270 can be similar to, or the same as, the barrier layer 1070 of FIG. 10F, discussed above. The metal layer 1272 can be similar to, or the same as, the metal layer 1072 of FIG. 10F. Thus, FIG. 11 illustrates one example of a process for forming a memory device with discrete charge trap features having a radius of curvature. The charge trap feature formed via the process 1100 may be the same as, or similar to, the charge trap feature illustrated in FIG. 3F.

FIGS. 13A-13D illustrate cross sections of several variations of memory cells having memory nodes with a radius of curvature. Specifically, FIGS. 13A-13D illustrate variations of the tier oxide and channel.

Figure 13A:
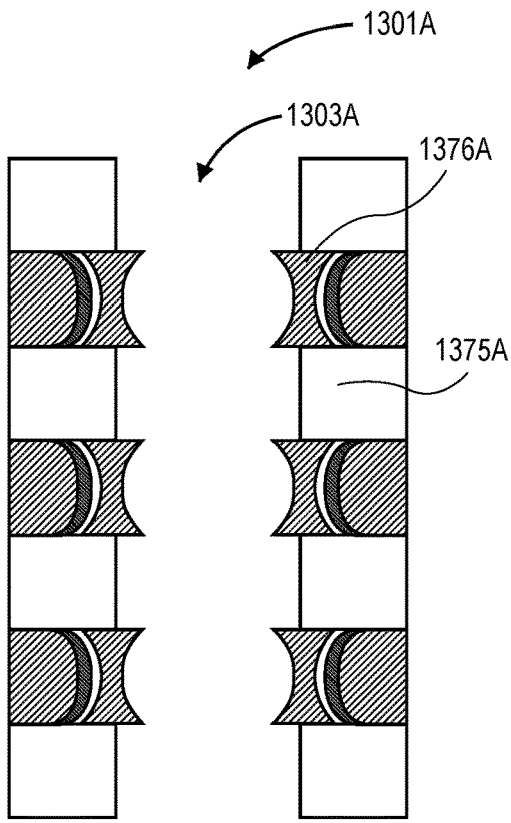
FIGS. 13A-13D illustrate cross sections of several variations of a memory cell having a memory node with a radius of curvature.

FIG. 13A illustrates an example in which the tier oxide (e.g., the layers of oxide 1375A in the stack 1301A) is etched or recessed. In the example illustrated in FIG. 13A, the layers of oxide 1375A are etched to form recesses in the side walls of the hole 1303A at the layers of oxide 1375A. In one example, the layers of oxide 1375A can be recessed as far as the full length of the floating gate. In one such example, the layers of oxide 1375A are etched after formation of the floating gates 1376A. The example in FIG. 13A, the layers of oxide 1375A are etched so that the floating gates 1376A form protrusions in the channel hole 1303A. In the example of FIG. 13A, the layers of oxide 1375A are etched to have a straight, non-curved topology or profile.

Figure 13B:
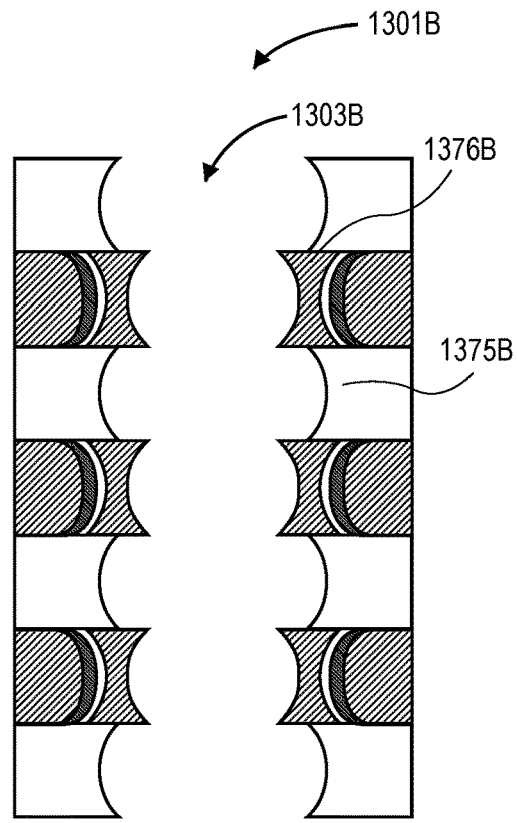

In contrast, FIG. 13B illustrates an example of a substrate 1301B in which the tier oxide is etched to form curved recesses. Like in FIG. 13A, the layers of oxide 1375B are etched after formation of floating gates 1376B to cause recesses at the layers of oxide 1375B, and further causing the floating gates to protrude in the channel hole 1303B. However, the layers of oxide 1375B are etched to form curved or concave recesses.

Figure 13C:
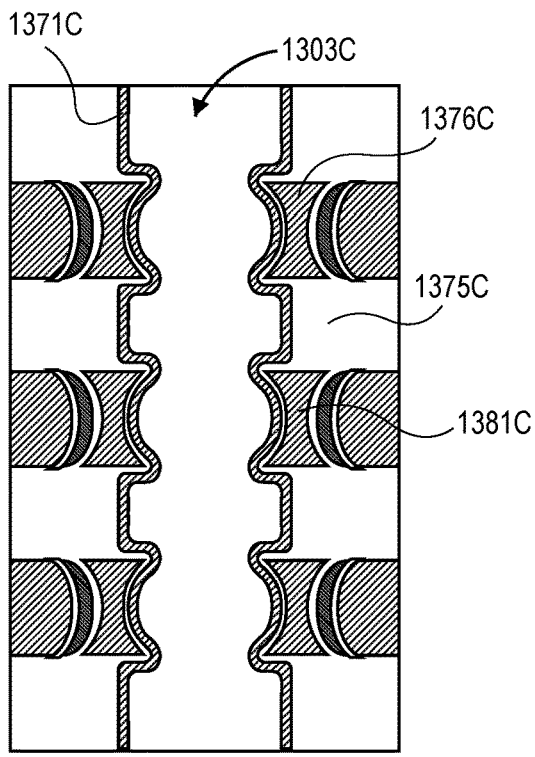
Figure 13D:
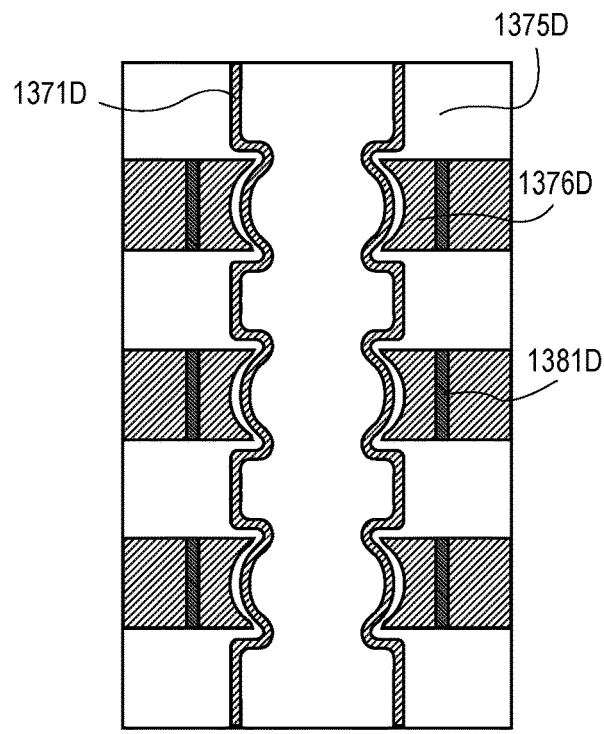

FIGS. 13C and 13D illustrate examples in which the channel layer is deposited over recessed tier oxide. Referring to FIG. 13C, layers of oxide 1375C are etched back at the channel-facing side to form non-curved recesses like in FIG. 13A. The channel 1371C is then deposited (and may also be etched) to form a conformal layer in the hole 1303C over the layers of oxide 1375C and the floating gates 1376C. Thus, in the example illustrated in FIG. 13C, the channel is recessed at the layers of oxide 1375C. In the illustrated example, the radius of the channel is therefore greater at the layers of oxide 1375C than at the floating gates 1376C. The example illustrated in FIG. 13C shows floating gates 1376C with a curved surface on both its channel-facing side and its control gate-facing side 1381C. FIG. 13D also illustrates a channel layer 1371D deposited over recessed layers of oxide 1375D, but in an implementation with a non-curved surface on the control gate-facing side 1381D of the floating gates 1376D.

Thus, the tier oxide can be etched back so that it is recessed relative to the floating gates. A channel layer formed over recesses in the tier oxide may then also be recessed at the layers of oxide. The tier oxide recess and channel modification are not limited to the examples illustrated in FIGS. 13A-13D but may be included in any of the memory device variations discussed herein. The position of the oxide recess relative to tier conductor may depend on a number of factors, such as a co-optimization of gate dielectric materials, channel material mobility, and geometric factors. The position of the oxide of recess (or protrusion) may also depend on the specific geometric configuration as well as the blocking layer dielectric and channel material properties.

Figure 14:
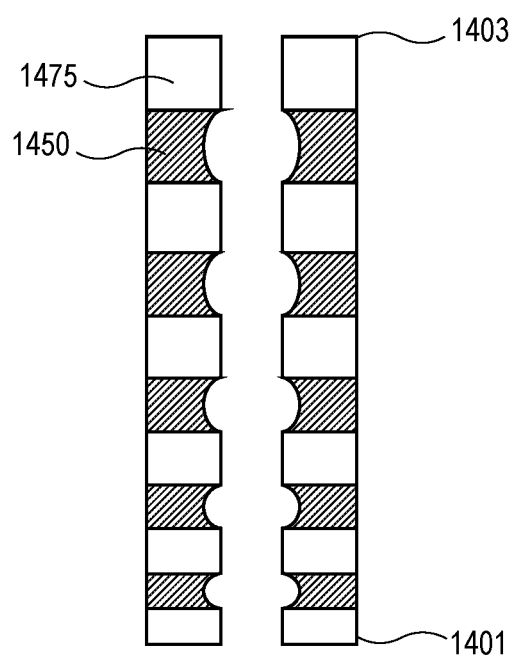
FIG. 14 illustrates another variation of memory cell having a memory node with a radius of curvature.

FIG. 14 illustrates another variation that may be present in any of the memory devices discussed herein. Although all of the previous examples show the alternating layers of conducting material 1450 and insulating material 1475 as having consistent thickness throughout the stack, the layers 1450 and 1475 may have different thicknesses. In the illustrated example, the thickness of the layers 1450 and 1475 may vary based on their location (e.g., vertical location) in the stack. In the illustrated example, the layers nearest to the top 1403 of the stack are thicker than the layers nearest to the bottom 1401 of the stack. Other implementations may have thicker layers at the bottom or middle of the stack. Thus, different dimension features may exist within a single stack/substrate. The different dimension features may be achieved through variable stack layer deposition thickness and similar lateral material removal amount.

Figure 15:
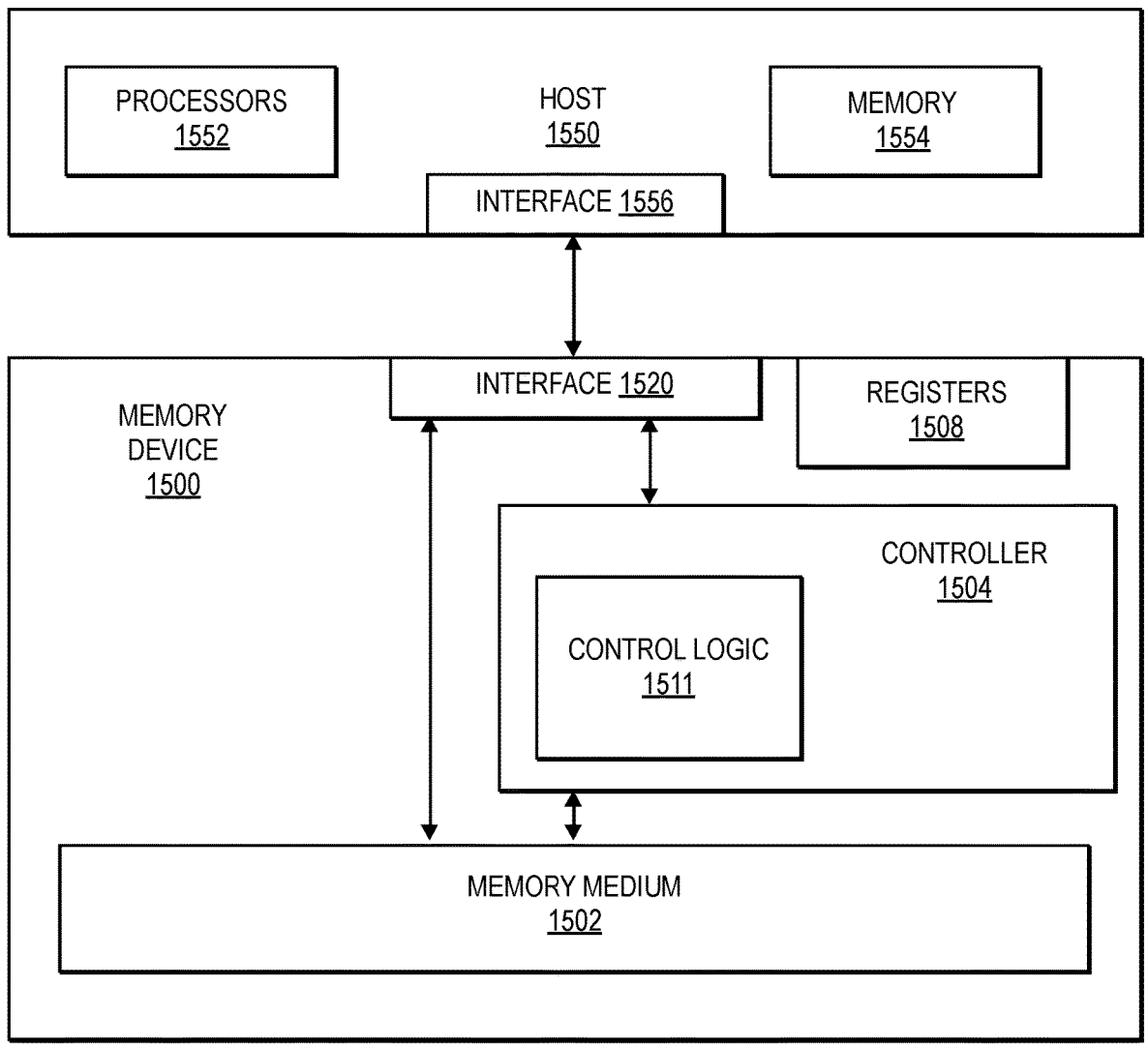
FIG. 15 depicts an example of a system with a memory device.

FIG. 15 depicts an example system in which memory devices with memory nodes having a radius of curvature may be included. The system includes a host 1550 and a memory device 1500. The host 1550 and memory device 1500 can be an example of a system that exists within the confines of a computer's package (e.g., within a laptop/notebook, server, or other computer). In other examples, the memory device 1500 may also be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 1550 includes one or more processors 1552, memory 1554, and other components that are omitted from the drawing for clarity.

The memory device includes a memory medium 1502 for storing data. Memory medium 1502 can be a memory or storage medium that can store one or more bits in one or more arrays of memory cells. For example, the memory medium 1502 can include non-volatile and/or volatile types of memory. In one example, the memory medium 1502 includes one or more non-volatile memory die. In some examples, the memory medium 1502 can include block addressable memory devices, such as NAND technologies. In one example, the memory medium 1502 includes a NAND flash memory array such as the array in FIG. 1. The memory medium 1502 can also include non-volatile types of memory, such as 3D crosspoint memory (3DxP), or other byte addressable non-volatile memory. Other technologies, such as some NOR flash memory, may be byte addressable for reads and/or writes, and block addressable for erases. The memory medium 1502 can include memory devices that use chalcogenide phase change material, multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 1502 can include a single-level cell (SLC) NAND storage device, a multi-level cell (MLC) NAND storage device, triple-level cell (TLC) NAND storage device, quad-level cell (QLC) storage device. The memory medium 1502 may include memory devices such as those described herein with memory nodes having radii of curvature.

The memory device 1500 can communicate with a host system 1550 using respective interfaces 1520 and 1556. In one example, the interface 1556 is a part of a peripheral control hub (PCH). In the illustrated example, the controller 1504 is coupled with a computing platform such as host 1550 using the interface 1520. In one example, the controller 1504 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 1504 can communicate with elements of the computing platform to read data from memory medium 1502 or write data to memory medium 1502.

The controller 1504 includes control logic 1511 to control or command the memory 1502 to cause operations to occur (e.g., read, program, erase, suspend, resume, and other operations). Communication between the memory medium 1502 and the controller 1504 may include the writing to and/or reading from specific registers (e.g., registers 1508).

Figure 16:
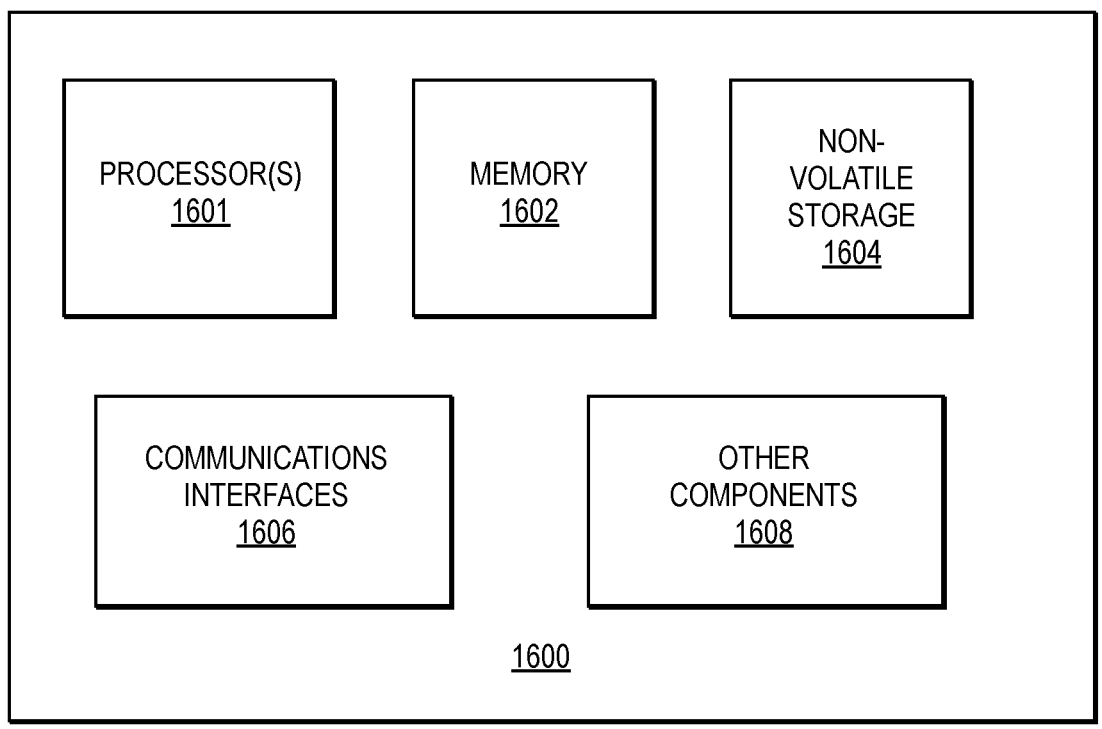
FIG. 16 depicts a computing system.

FIG. 16 provides an exemplary depiction of a computing system 1600 (e.g., a smartphone, a tablet computer, a laptop computer, a desktop computer, a server computer, etc.). As observed in FIG. 16, the system 1600 may include one or more processors or processing units 1601. The processor(s) 1601 may include one or more central processing units (CPUs), each of which may include, e.g., a plurality of general-purpose processing cores. The processor(s) 1601 may also or alternatively include one or more graphics processing units (GPUs) or other processing units. The processor(s) 1601 may include memory management logic (e.g., a memory controller) and I/O control logic. The processor(s) 1601 can be similar to, or the same as, the processors 1552 of FIG. 15.

The system 1600 also includes memory 1602 (e.g., system memory), non-volatile storage 1604, communications interfaces 1606, and other components 1608, which may also be similar to, or the same as, components of the host 1550 of FIG. 15. The other components may include, for example, a display (e.g., touchscreen, flat-panel), a power supply (e.g., a battery and/or other power supply), sensors, power management logic, or other components. The communications interfaces 1606 may include logic and/or features to support a communication interface. For these examples, communications interface 1606 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1604, which may be the mass storage component of the system. The non-volatile storage 1604 can be similar to, or the same as, the memory device 1500 of FIG. 15, described above. Non-volatile storage 1604 may include byte or block addressable types of non-volatile memory having a 3-dimensional (3D) cross-point memory structure that includes chalcogenide phase change material (e.g., chalcogenide glass) hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 1604 may include mass storage that is composed of one or more SSDs. SSDs can be composed of flash memory chips with storage configurations as described above.

Thus, processing conditions may be modified to introduce a radius of curvature to exploit radius of curvature field enhancement effects to maximize the (program/erase) Vt window of the cell transistor. Disclosed structures add additional radial component along orthogonal axis to enable maximization of the total Vt window. In one example, the additional radial component is comparable to or slightly less than the existing channel/pillar radius. The techniques disclosed herein also scale favourably with the trend of tier pitch reduction. The radius of curvature can enable improvements in device operation and enable future scaling (e.g., total stack height reduction).

Examples of storage nodes follow. In one example, an integrated circuit includes a filled hole in a substrate, the filled hole including a semiconductor channel film and a storage node surrounding the semiconductor channel film, the storage node having a radius of curvature. The radius of curvature of the storage node is less than or equal to a radius of the semiconductor channel film. The integrated circuit includes a control gate surrounding the storage node. In one example, a channel-facing side of the storage node includes a concave surface with the radius of curvature. In one example, a storage node-facing side of the semiconductor channel film includes a convex surface. In one example, the radius of the semiconductor channel film is the smallest radius of the semiconductor channel film, and the radius of curvature of the concave surface on the channel-facing side of the storage node is less than the smallest radius of the semiconductor channel film.

In one example, the storage node includes a floating gate having the radius of curvature. In one example, a channel-facing side of the floating gate includes a concave surface with the radius of curvature. In one example, a control gate-facing side of the floating gate includes a concave surface with a second radius of curvature. In one example, the second radius of curvature is less than or equal to the radius of the semiconductor channel film. In one example, a storage node-facing side of the control gate includes a convex surface. In one example, a control gate-facing side of the floating gate includes a flat surface. In one example, the floating gate includes tapered upper and lower edges between a channel-facing side and a control gate-facing side of the floating gate wherein a height of the floating gate is greater at the channel-facing side than at the control gate-facing side. In one example, the tapered upper and lower edges form a multi-faceted control gate-facing side of the floating gate. In one example, the floating gate includes non-tapered upper and lower edges between a channel-facing side and a control-gate facing side of the floating gate.

In one example, the storage node is a charge trap layer having the radius of curvature. In one example, the charge trap layer is continuous between vertically adjacent cells. In one example, the charge trap layer is isolated from charge trap layers of vertically adjacent cells. In one example, a plurality of vertically stacked NAND memory cells are around the semiconductor channel film, the plurality of vertically stacked NAND memory cells having storage nodes with differing radiuses of curvature.

In one example, a non-volatile storage device includes an array of NAND memory cells, a cell of the array including a storage node around a semiconductor channel film, the storage node including a radius of curvature that is less than or equal to a radius of the semiconductor channel film, and control circuitry to access the array of NAND memory cells. In one example, a system includes a processor and a non-volatile storage device in accordance with any of the non-volatile storage devices described herein. In one example, the non-volatile storage device comprises a NAND flash solid state drive (SSD) or a dual inline memory module (DIMM).

In one example, a method of manufacturing a non-volatile memory device involves etching a hole in a substrate, the substrate comprising alternating layers of a conducting material and an insulating material. Recesses are etched inside walls of the hole at the layers of conducting material. One or more layers of dielectric material are formed in each of the recesses. A floating gate is formed over or adjacent to the one or more layers of dielectric material in each of the recesses, the floating gate having a radius of curvature. A tunnel dielectric layer is formed over the floating gate in each recess, and a channel layer is formed in the hole adjacent to or over the tunnel dielectric layer, wherein the radius of curvature of the floating gate is less than a radius of the channel layer. In one example, forming the floating gate in each of the recesses involves depositing a polysilicon layer in the hole over the one or more layers of dielectric material in each of the recesses and partially etching the polysilicon layer to form isolated floating gates. In one example, the method involves forming the alternating layers of the conducting material and the insulating material, wherein forming the layers of conducting material involves, for each of the layers of conducting material: adjusting the composition of the layer to have a higher etch rate at a bottom and top region of the layer than at a middle region of the layer.

In one example, etching the recesses in side walls of the hole involves etching the bottom region and top region of each of the layers of conducting material at a faster rate than the middle region to form the recesses with a second radius of curvature, the second radius of curvature less than or equal to the radius of the channel layer. In one example, forming the one or more dielectric layers in each of the recesses involves forming a first dielectric layer on the layer of conductive material in each of the recesses and forming a second dielectric layer over the first dielectric layer in each of the recesses. In one example, forming the second dielectric layer involves forming the second dielectric layer to have a tapered edge. In one example, forming the second dielectric to have a tapered edge involves forming a sacrificial protection layer over the second dielectric layer, etching the sacrificial protection layer to expose the second dielectric layer at edges of the recesses near the floating gate and at the layers of insulating material, and etching or oxidizing the edges of the second dielectric layer. In one example, forming the floating gate involves forming the floating gate to have a tapered edge adjacent to the tapered edge of the second dielectric layer.

In one example, forming the one or more dielectric layers in each of the recesses involves depositing a first dielectric layer over the conductive material and not over the layers of insulating material via area selective atomic layer deposition (AS-ALD), and depositing a second dielectric layer over the first dielectric layer. In one example, the process involves etching a slit on two opposing sides of the hole and removing the layers of conductive material adjacent to the first dielectric layer in each recess via an etch process in the slits; forming the one or more dielectric layers in each of the recesses involves forming a third dielectric layer over an exposed surface of the first dielectric layer exposed by removal of the layers of conductive material. In one example, the method involves depositing a conductive material over the third dielectric layer in each of the recesses to form control gates.

In another example, a method of manufacturing a non-volatile memory device involves etching a hole in a substrate, the substrate including alternating layers of oxide and nitride, etching recesses in side walls of the hole at the layers of nitride, forming one or more dielectric layers in each of the recesses, forming a charge trap layer over the one or more dielectric layers, the charge trap layer having a radius of curvature, forming a tunnel dielectric layer over the charge trap layer, and forming a channel layer adjacent to the tunnel dielectric layer, wherein the radius of curvature of the charge trap layer is less than a radius of the channel layer. In one example, the method further involves etching a slit on two opposing sides of the hole, etching the layers of nitride adjacent to the one or more dielectric layers via the slits, and depositing a conductive material adjacent to the one or more dielectric layers via the slits. In one example, prior to depositing the conductive material, the method involves forming one or more additional dielectric layers via the slits.

In another example, a method of manufacturing a non-volatile memory device involves etching a hole in a substrate, the substrate including alternating layers of oxide and polysilicon, etching recesses in side walls of the hole at the layers of polysilicon, forming a charge trap layer on the polysilicon in each of the recesses, the charge trap layer having a radius of curvature, wherein charge trap layers in vertically adjacent recesses are isolated from one another, forming a tunnel dielectric layer over the charge trap layer, and forming a channel layer over the tunnel dielectric layer, wherein the radius of curvature of the charge trap layer is less than a radius of the channel layer. In one example, forming the charge trap layer involves depositing a nitride layer via area selective atomic layer deposition (AS-ALD). In one example, the method further involves etching a slit on two opposing sides of the hole, removing the layers of polysilicon adjacent to the charge trap layer in each of the recesses via an etch process via the slits, depositing one or more dielectric layers over exposed surfaces of the charge trap layer in each of the recesses via the slits, and depositing a conductive material over the one or more dielectric layers via the slits.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:
1. An integrated circuit comprising:
   a filled hole in a substrate, the filled hole including a semiconductor channel film;
   a storage node surrounding the semiconductor channel film, the storage node having a radius of curvature, wherein the radius of curvature of the storage node is less than or equal to a radius of the semiconductor channel film; and
   a control gate surrounding the storage node.
2. The integrated circuit of claim 1, wherein:
   a channel-facing side of the storage node includes a concave surface with the radius of curvature.
3. The integrated circuit of claim 1, wherein:
   a storage node-facing side of the semiconductor channel film includes a convex surface.
4. The integrated circuit of claim 2, wherein:
   the radius of the semiconductor channel film comprises a smallest radius of the semiconductor channel film; and
   the radius of curvature of the concave surface on the channel-facing side of the storage node is less than the smallest radius of the semiconductor channel film.
5. The integrated circuit of claim 1, wherein:
   the storage node comprises a floating gate having the radius of curvature.

6. The integrated circuit of claim 5, wherein:
a channel-facing side of the floating gate includes a concave surface with the radius of curvature.

7. The integrated circuit of claim 6, wherein:
a control gate-facing side of the floating gate includes a concave surface with a second radius of curvature.

8. The integrated circuit of claim 7, wherein:
the second radius of curvature is less than or equal to the radius of the semiconductor channel film.

9. The integrated circuit of claim 5, wherein:
a storage node-facing side of the control gate includes a convex surface.

10. The integrated circuit of claim 5, wherein:
a control gate-facing side of the floating gate includes a flat surface.

11. The integrated circuit of claim 5, wherein:
the floating gate includes tapered upper and lower edges between a channel-facing side and a control gate-facing side of the floating gate; and
wherein a height of the floating gate is greater at the channel-facing side than at the control gate-facing side.

12. The integrated circuit of claim 11, wherein:
the tapered upper and lower edges form a multi-faceted control gate-facing side of the floating gate.

13. The integrated circuit of claim 5, wherein:
the floating gate includes non-tapered upper and lower edges between a channel-facing side and a control-gate facing side of the floating gate.

14. The integrated circuit of claim 1, wherein:
the storage node comprises a charge trap layer having the radius of curvature.

15. The integrated circuit of claim 14, wherein:
the charge trap layer is continuous between vertically adjacent cells.

16. The integrated circuit of claim 14, wherein:
the charge trap layer is isolated from charge trap layers of vertically adjacent cells.

17. The integrated circuit of claim 1, further comprising:
a plurality of vertically stacked NAND memory cells around the semiconductor channel film, the plurality of vertically stacked NAND memory cells having storage nodes with differing radiuses of curvature.

18. A non-volatile storage device comprising:
an array of NAND memory cells, a cell of the array including:
a storage node around a semiconductor channel film, the storage node including a radius of curvature that is less than or equal to a radius of the semiconductor channel film; and
control circuitry to access the array of NAND memory cells.

19. The non-volatile storage device of claim 18, wherein:
a channel-facing side of the storage node includes a concave surface with the radius of curvature.

20. A system comprising:
a processor; and
a non-volatile storage device coupled with the processor, the non-volatile storage device comprising an array of NAND memory cells, a cell of the array including:
a storage node around a semiconductor channel film, the storage node including a radius of curvature that is less than or equal to a radius of the semiconductor channel film.

21. The system of claim 20, wherein:
the non-volatile storage device comprises a NAND flash solid state drive (SSD) or a dual inline memory module (DIMM).

* * * * *